United States Patent [19]

West

[11] Patent Number: 5,475,624
[45] Date of Patent: Dec. 12, 1995

[54] TEST GENERATION BY ENVIRONMENT EMULATION

[75] Inventor: Burnell G. West, Fremont, Calif.

[73] Assignee: Schlumberger Technologies, Inc., San Jose, Calif.

[21] Appl. No.: 876,566

[22] Filed: Apr. 30, 1992

[51] Int. Cl.$^6$ .................................................. G06F 17/00
[52] U.S. Cl. ........................... 364/578; 371/26; 371/25.1
[58] Field of Search .......................... 371/16.2, 23, 25.1, 371/68.1, 68.3; 364/579, 580, 578; 324/73.1

[56] References Cited

U.S. PATENT DOCUMENTS

| | | | |
|---|---|---|---|
| 4,791,603 | 12/1988 | Henry | 395/800 |
| 4,862,399 | 8/1989 | Freeman | 364/580 |
| 4,868,825 | 9/1989 | Koeppe | 371/23 |
| 4,901,259 | 2/1990 | Watkins | 364/578 |
| 4,996,659 | 2/1991 | Yamaguchi et al. | 364/579 |
| 5,058,112 | 10/1991 | Namitz et al. | 371/3 |
| 5,146,460 | 9/1992 | Ackerman et al. | 371/23 |
| 5,184,308 | 2/1993 | Nagai et al. | 364/489 |
| 5,189,365 | 2/1993 | Ikeda et al. | 324/158 R |

OTHER PUBLICATIONS

West et al., "Test Generation by Environment Emulation," Jan. 30, 1991, pp. 1–3.
RPM Emulation System™ Data Sheet, Quickturn Systems, Inc., Mountain View, California, 1991, pp. 1–12.
Considerations For Target System Slowdown—Application Note #4, Quickturn Systems, Inc., Mountain View, California, 1990, pp. 1–10.
S. Walters, *ASIC design also require ICE*, Electronic Engineering Times, CMP Publications, Manhasset, New York, Dec. 10, 1990, Issue 620, 1 page.
P. Goel, *The simulation vs. emulation debate*, Electronic Engineering Times, CMP Publications, Manhasset, New York, 1990, 1 page.
H. Wolff, *How Quickturn is Filling a Gap*, ELectronics, Apr. 1990, 1 page.
S. Walters, *Reprogrammable hardware Emulation Automates System–Level ASIC Validation*, ASIC Prototyping Alternatives For System–Level Design Validation, Technical Program Session EA2, Anaheim Convention Center, Nov. 13, 1990, 4 pages.

*Primary Examiner*—Ellis B. Ramirez
*Attorney, Agent, or Firm*—Kenneth Olsen; Keith G. W. Smith; Bruce D. Riter

[57] ABSTRACT

Generation, validation and fault-grading of test patterns, and test and debug of logic circuits, are enhanced by emulation of the logic circuits in programmable gate arrays. Two emulations of the logic circuit are preferably created, one of which is a "good" model containing no faults and the other of which is a "faultable" model into which possible faults may be selectively introduced. A fault is introduced in the faultable model, and the two models are exercised in parallel by applying the same pattern of test vectors to both models. The test vector pattern may be generated by an emulation of the intended operating environment of the logic circuit. Differences in the output signals of the two models indicate that the fault has been detected by the applied test pattern. Application of the test pattern is repeated for each of a sequence of possible faults, to determine the extent to which the test pattern enables detection of faults in the logic circuit. A fault dictionary is produced which includes an indication of the test vector at which each fault is detected, the output signal differences indicative of fault detection, and a log of the faults detected. The faultable emulation is also used for device testing by comparing its outputs to those of a logic circuit, and injecting selected faults (for example, those indicated by comparing failure patterns to fault dictionary entries) to aid in device debug. Techniques are described for modeling faults, sequentially activating the faults in hardware time, preparing a fault dictionary, and extracting a test program in a format adaptable to standard ATE systems, and testing a debugging devices by comparing their behavior to that of a faultable emulation model of the device.

28 Claims, 15 Drawing Sheets

TEST GENERATION BY ENVIRONMENT EMULATION

BACKGROUND OF THE INVENTION

1. Field of the Invention

The present invention relates to test pattern generation and execution by environment emulation. In particular, the present invention relates to emulation of an integrated circuit device and its intended operating environment to facilitate generation of test patterns having improved fault-detection coverage.

2. The Prior Art

Integrated circuit (IC) device fabrication prior to thorough design verification is no longer acceptable as the cost of first-article fabrication continues to climb. This problem was addressed in the last two decades by circuit-level simulators, then by switch-level simulation, then gate-level, then register-transfer-level, behavioral, and now mixed-mode simulators which combine the best features of all. But still the time required to create and explore a complex design remains the biggest development cost.

Simulations using best available technology run hours, even days, and only exercise these complex devices in a very rudimentary way. Device after device is released into the marketplace with performance :flaws not detected by simulation, not because the simulation was inaccurate but because it did not contain the conditions required to exhibit these flaws.

Test patterns derived from logic designs, particularly those which are created automatically from structure presented by the design file, in principle cannot discover such logic errors. Testability is addressed. Controllability and observability are enhanced. Even test coverage can be assessed accurately enough with weeks of ever less expensive CPU time. But the answer to the key question, whether the device does what it should, remains elusive.

The traditional approach answers this question by building the device and checking it out, in the system. All the costs of system prototype assembly are thus risked on unproven designs.

Traditional IC-Based System Design Methodology

FIG. 1 illustrates a methodology traditionally employed in design of IC-based systems. Beginning with an initial idea 100, a concept description 102 is prepared, and ergonomic requirements 104 and environmental requirements 106 are established. System specifications 108 and system architecture 110 are then defined from the concept description and ergonomic and environmental requirements. Software requirements 112 and subsystem requirements 114 are in turn determined from the system specifications and architecture.

System software specifications 116, system electrical specifications 118 and system mechanical specifications 120 are developed from the software and subsystem requirements. Software module definition 122 follows from the system software and electrical specifications. Software development 124 and testing 126 are then performed prior to software modules integration 128.

Component definition 130 follows from the system software specifications 116 and system electrical specifications 118, taking account of system mechanical design and assembly requirements 132 developed from system mechanical specifications 120. Component design 134 is carried out in accordance with component definition 130, followed by component design verification 136 and component fabrication 138. Component test specifications 140 are developed in light of the component definition 130 and the component design 134. Component test and characterization 142 is conducted with the fabricated components, using the component test specification. The integrated software, tested and characterized components, and system mechanical design all go into final system integration 144.

There are at least two significant weaknesses in this traditional flow. First, the component definition-fabrication loop is very time-consuming. This is due in part to the amount of analytical effort required to verify design accuracy before devices are implemented. Also, fabrication time following design completion is a number of weeks or months.

Second, there is no software-hardware verification until system integration. Critical interactions between the newly defined components and the software which drives them are delayed by the lead time of the new components. Software engineers routinely cope with this lead time, but frequently find that they have built code for a task and then have had to put it on the shelf for long periods before fully testing it. All the "dry-lab" work in the world does not substitute for having the component in place for test.

IC Emulation vs. Simulation

A new technology for logic device design has appeared—the technology of logic emulation. This technology has proven itself already by showing that hardware emulation can perform at speeds millions of times faster than comparable simulations, frequently running fast enough to demonstrate design functionality at system speeds.

In one example, the Quickturn RPM Emulation System was used to emulate the video graphics display processor of a personal computer. While a flight simulation program was running on the personal computer, the gate-array emulation of the display processor was operated in real-time to produce screen displays. Waveforms within the emulation model were provided on a separate display screen, allowing operation of the display processor in its intended environment to be monitored.

FIG. 2 illustrates the use of a prior-art emulation system for in-circuit emulation of an application-specific IC (ASIC) in a target system 200. Emulation system hardware 210, such as the RPM Emulation System® offered commercially by Quickturn System, Inc., of Mountain View, Calif., is connected by a cable assembly 220 to target system 200 in place of the ASIC. The ASIC design, generated with Computer-Aided Engineering (CAE) tools on a CAE workstation 230, is loaded into emulation system 210.

Referring to FIG. 3, the Quickturn RPM emulation system hardware 210 comprises a matrix of reprogrammable CMOS gate arrays 300 having 50,000 or more gates. Cable assembly 220 comprises a pod cable 315 leading from gate arrays 300 to a pod 320, a plug adapter 325 for connection to an ASIC socket 330, and an adapter cable 335 connecting pod 320 to plug adapter 325. Pod 320 contains logic which buffers signals to target system 200. Component adapters 340 connected to gate arrays 300 allow existing ICs, such as microprocessors, peripherals, memory, and high-speed logic, to be included in the emulation. The existing ICs become a part of the functional emulation of the ASIC. Also coupled to gate arrays 300 are a stimulus generator 345 and a logic analyzer 350 for exercising logic programmed into gate arrays 330 and analyzing the resulting activity. A control processor 355 interfaces workstation 230 to gate arrays 300.

Workstation 230, such as a Sun Microsystems workstation, includes a processor 360 programmed with emulation software 365, a monitor with keyboard (or other input device) 370, a disk drive 375 and a tape drive 380. Connection to other devices or data sources may be made through a data bus 385 (e.g., a SCSI bus) and/or a network bus 390 (e.g., an Ethernet TCP/IP bus).

As illustrated in FIG. 4, emulation software 365 in the Quickturn RPM Emulation System receives ASIC design data 400 and ASIC design kits data 405. Software 365 includes a netlist parser/expander function 410, a partition place-and-route function 415, anal an emulation download function 420 which communicates with emulation hardware 210. A test vector converter function 425 receives test vector format 430 and ASIC design data 400. Control functions 435 are provided for stimulus generator 345 and logic analyzer 350.

Since ASIC's must often be designed in parallel with the target system, many users of logic emulation equipment have found that they must emulate all or part of the target system as well as the ASIC device to verify functionality of the ASIC device in the intended operating environment. Such emulation permits a much richer exploration of device behavior than does simulation, because it runs at hardware speeds (though not necessarily at target system speeds).

FIG. 5 illustrates schematically one manner in which emulations are used in the prior art design process. An emulation of a target device 500 (such as an ASIC under development) communicates over a device I-O boundary 505 with its intended environment 510. The communication is effected by means of device input signals 515 and device output signals 520. External stimulus 525 is applied to environment 510 as appropriate.

Emulation technology differs from simulation technology in a number of ways. Simulation involves creating software models of the devices and executing a program which instantiates and interconnects data flows through these models. Emulation consists of modeling specific circuits by programming reconfigurable elements with real, programmable connections between them. A principal advantage of emulation is that emulation models run at hardware speeds rather than at software speeds. While emulation speeds cannot normally be expected to reach the actual operating speeds of the target devices, they can be five or more orders of magnitude faster than software simulations.

Other advantages arise from the nature of the emulation concept. The process of modeling the environment as simplified abstract representations of target systems creates an unexpected form of discipline in requirements definition. Interface models created to help define the target device environment are used directly to help define the remainder of the system, or are drawn directly from the system definition. This aids communication between design groups assigned different tasks in realization of the system.

However, emulation of the device and its environment as currently developing have three major deficiencies in establishing test vectors. First, device timing is completely ignored—the emulation model may exhibit race conditions which do not exist in the real device, or vice versa. Second, simulations exhibit indeterminate ("X") states clearly and aid in designing proper device initialization, while emulations, like real hardware, have no "X" states. Third, there is no inherent "fault model" technology for determining test coverage.

During traditional device development, fault simulation normally does not commence until the device is designed and the planned production test program is known. One of the most critical shortcomings of the current simulation approach to device test development is the excruciatingly long times required to establish fault coverage. Indeed, this problem is so severe that in many cases production tests are routinely used for which the actual fault coverage is never established. Only after defective devices are located in field applications does the weakness of the production test show up.

Fault coverage cannot be considered as such without dealing explicitly with fault types and their corresponding models. The most common device faults are those associated with stuck nodes. Though fault coverage assuming a "stuck-at" fault model is defined in a straightforward way, the cost of simulation time prevents its being evaluated. There are, of course, other possible faults.

Testability measures—rules of thumb based on the complexity of the circuit to be tested—are currently used to determine whether a given circuit design is testable, without fully evaluating the test to be used. As circuits become more complex, test decisions based on such heuristic inferences become less reliable. Designers thus add more circuitry for the purpose of making tests, making the overall circuit even more complex. The circuit may become more complex than it needs to be, even including redundant or unnecessary testability features. It would be preferable to generate and evaluate a production test as a part of the design process, particularly to assure testability of the .circuit before going into production, if this could be done cost-effectively.

SUMMARY OF THE INVENTION

Test pattern generation and execution by environment emulation is a new approach which offers a dramatic reduction in the time required for test development, test validation and debug, test quality (fault coverage) measurement, and device debug.

In accordance with preferred embodiments of the present invention, generation and evaluation of test patterns for testing of logic circuits are enhanced by emulation of the logic circuit. Two emulations of the logic circuit are preferably created, one of which is a "good" model containing no faults and the other of which is a "faultable" model into which possible faults may be selectively introduced. A fault is introduced in the faultable model, and the two models are exercised in parallel by applying the same pattern of test vectors to both models. The test vector pattern may be generated by an emulation of the intended operating environment of the logic circuit. Differences in the output signals of the two models indicate that the fault has been detected by the applied test pattern. Application of the test pattern is repeated for each of a sequence of possible faults, to determine the extent to which the test pattern enables detection of faults in the logic circuit. A fault dictionary entry may be recorded which includes an indication of the test vector at which each fault is detected, the output signal differences indicative of fault detection, and a log of the faults detected.

Techniques are described which may be used to model faults, sequentially activate the faults in hardware time, recover the resulting fault dictionary entries, and extract the logic pattern for a test program in a format easily adaptable to standard automated test equipment (ATE) systems. The equipment used is commercially-available logic hardware emulation equipment.

Preferred methods of the invention allow for introduction of such fault types as latchup, shorted nodes, interrupted nets, and so forth. Fault emulation time is dramatically less than with simulation techniques, opening the possibility for much more thorough fault coverage analysis, using more extensive and varied fault models. In a proposed emulation of a specific device of about 10,000-gate complexity, fault coverage would be determined by injecting over 32,000 faults in the device emulation, followed by full emulation testing of each fault. The process is estimated to require only minutes to achieve full fault-grading of the device (with generation of a fault dictionary), compared to an estimated 30 to 60 hours using standard simulation with single-stuck-at fault injection.

Also in accordance with preferred embodiments of the present invention, debug of an actual physical device, which may or may not contain faults, is facilitated by substituting the physical device for one of the emulation models. A test pattern is applied to the physical device and to the emulation model, and the output signals of the device are compared with the output signals of the emulation model for each vector of the pattern. If the emulation model is non-faulted and no output signal difference is detected, the device may be assumed to contain no faults. If the comparison shows a difference, the fault dictionary is consulted to locate a matching entry to determine the nature of the fault in the device. If faults of more than one kind have identical fault dictionary entries, the test pattern is revised to allow these faults to be distinguished. The revised test pattern is then applied to the device and to an emulation model and the results compared again; in this case, a fault suspected to exist in the device is preferably introduced in the emulation model to aid in identification of the nature of the fault.

BRIEF DESCRIPTION OF THE DRAWING

Preferred embodiments of the invention are described below with reference to the accompanying drawing Figures, in which.

DESCRIPTION OF THE PREFERRED EMBODIMENTS

In accordance with preferred embodiments of the invention, device emulation and environment emulation are combined to model the behavior of a target device (e.g., an ASIC under development) in its intended environment. Commercially available gate array emulation technology may be used, such as the Quickturn RPM Emulation System described above. Activity patterns monitored during the emulation are translated into test vector sets for standard automatic test equipment (ATE). Such emulation offers solutions to problems in initialization and test coverage.

Figure 1:
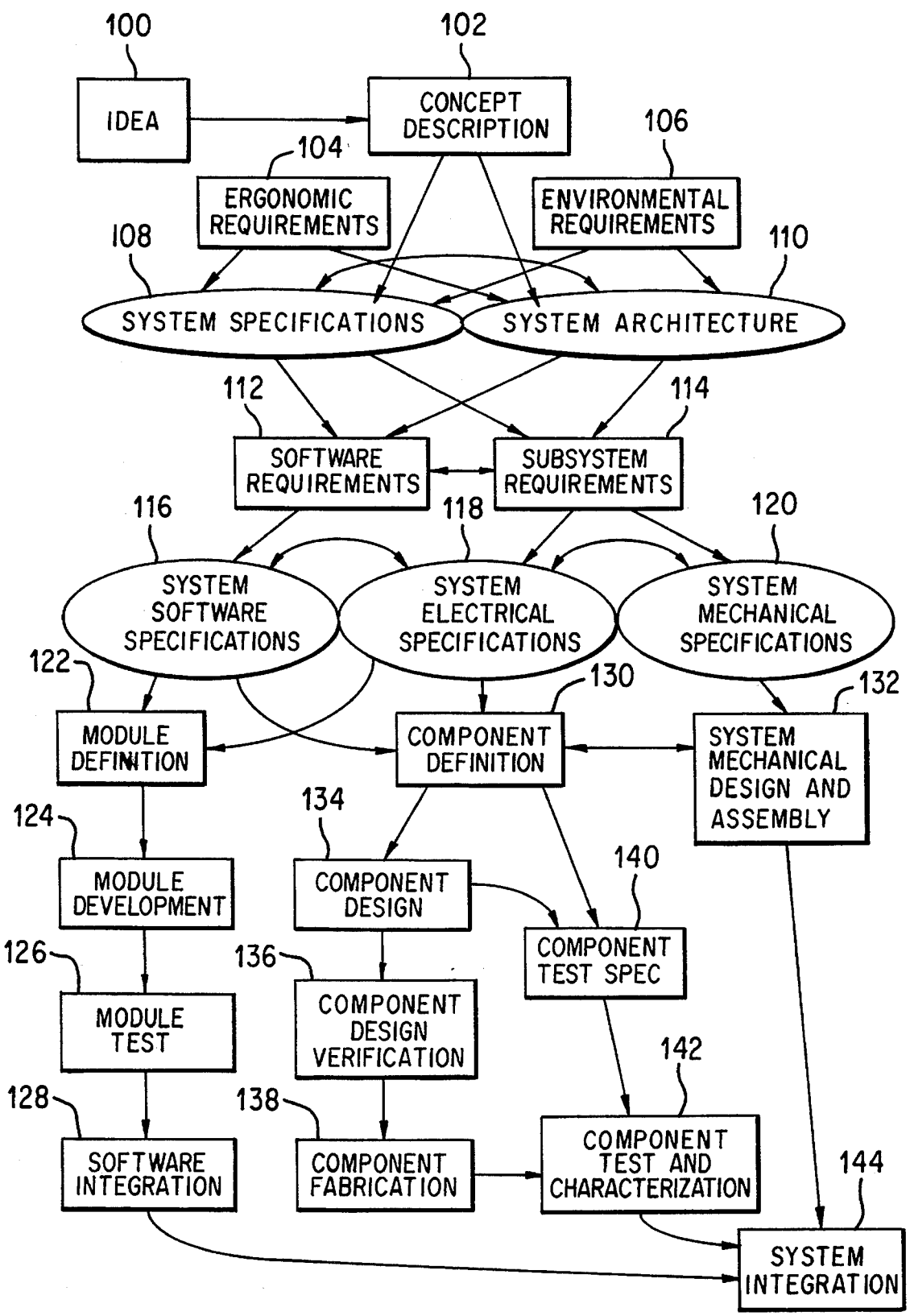
FIG. 1 illustrates a methodology traditionally employed in design of IC-based systems.
Figure 2:
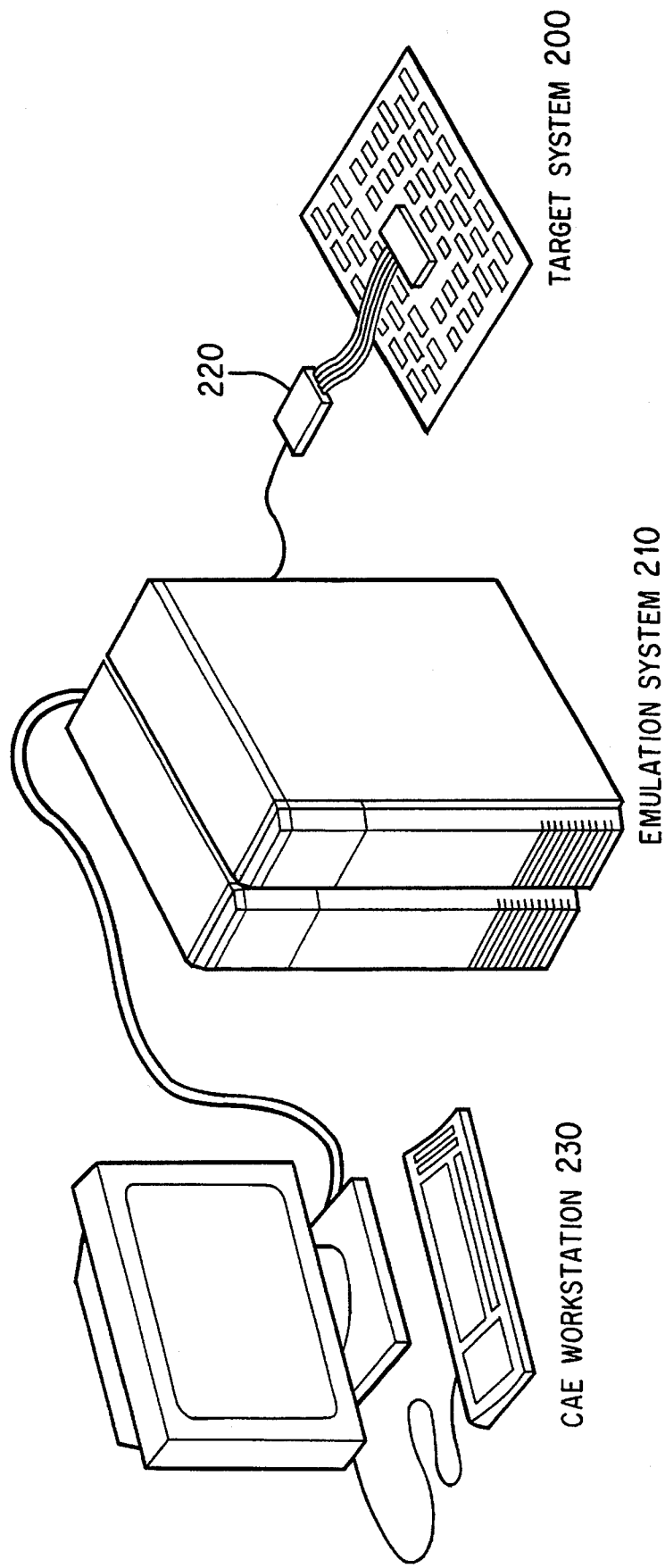
FIG. 2 illustrates the use of a prior-art emulation system for in-circuit emulation of an ASIC in a target system.
Figure 6:
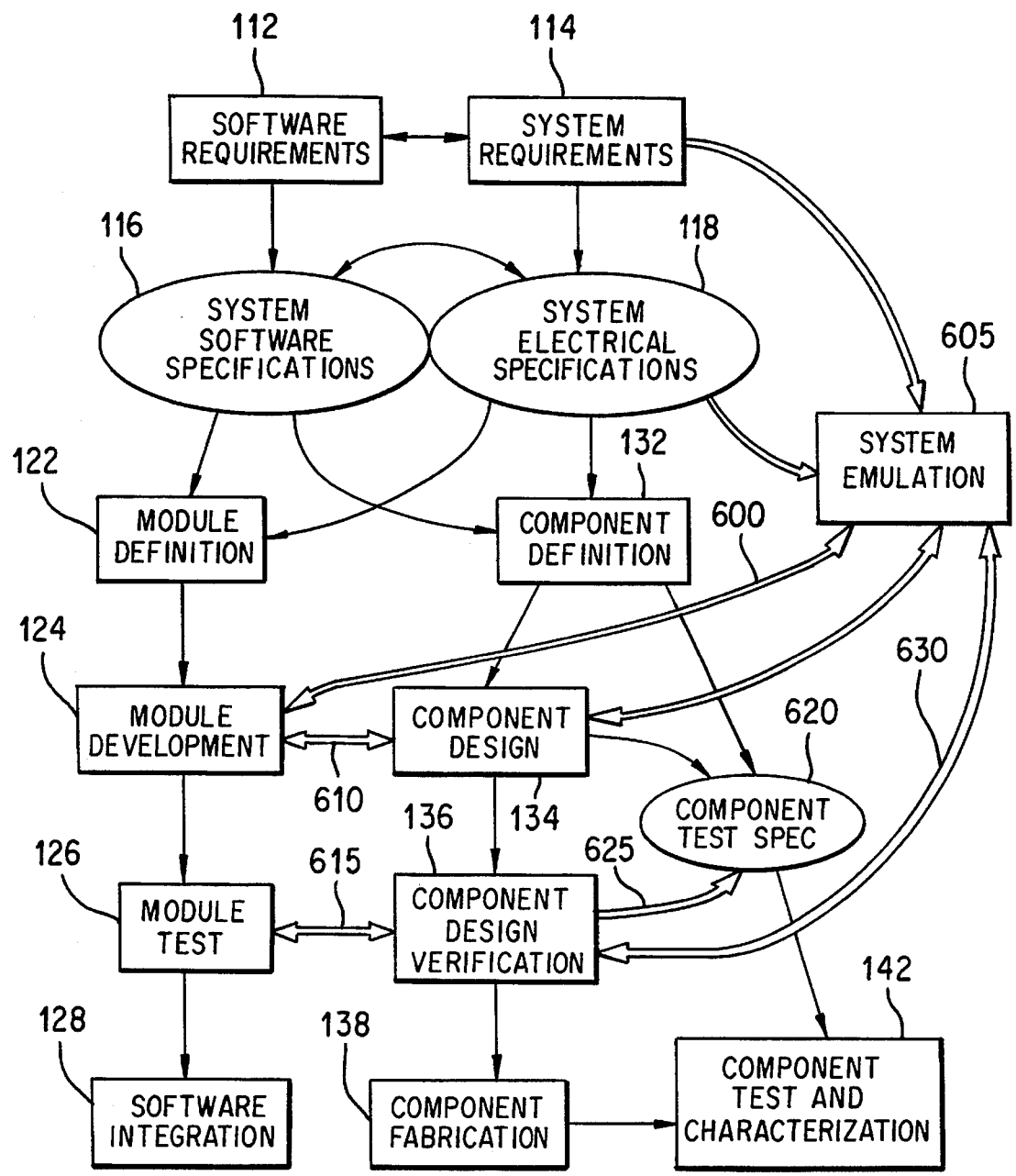
FIG. 6 illustrates preferred methods of the present invention involving modifications to the prior-art design process of FIG. 1.

Preferred methods of the present invention involve modifications to the prior-art design process described above, as illustrated in FIG. 6. For simplicity of illustration, FIG. 6 shows the lower left portion of FIG. 1, with proposed modifications in accordance with the present invention. Like steps of the process are shown with like reference numerals.

As represented by arrow 600, software module development 124 is tightly integrated with system emulation 605. As represented by arrow 610, software module development 124 is also integrated with custom component design 134. The software module test step 126 is tightly integrated with component design verification 136 as represented by arrow 615. The component test specification 620 is also tightly integrated with component design verification 136 as represented by arrow 625. Also, component design verification 625 is tightly integrated with system emulation 605 as represented by arrow 630. A benefit of this approach to design is that portions of the circuit which are unnecessary or which are not adequately tested can be discovered early in the design process. The design and/or the test may be modified during the design process to assure a streamlined design and full fault-coverage during production testing. Design changes can then be evaluated in the system context in the tightly-integrated coupling of system emulation and device design, shown by arrow 630.

Figure 7:
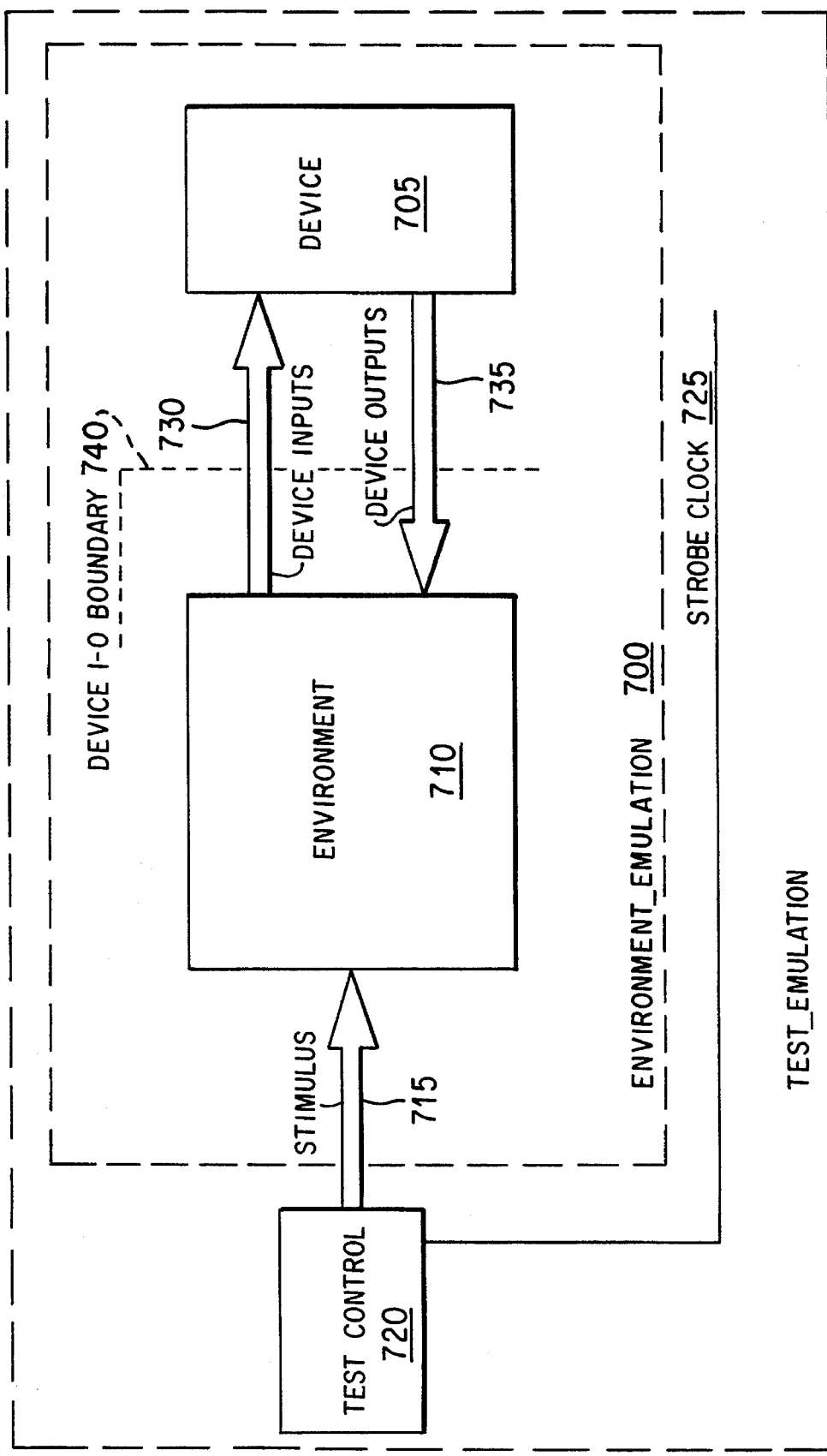
FIG. 7 illustrates the concept of test emulation in conjunction with environment emulation and device emulation, in accordance with the present invention.

The process is straightforward. Referring to FIG. 7, a simplified emulation model 700 of the target environment is created. Emulation model 700 includes an emulation 705 of the device and an emulation 710 of the environment. The design of the device is tested for functionality with the environment by providing stimulus 715 to environment 710 from a test control system 720 responsive to a strobe clock signal 725. That is, device emulation 705 is exercised by environment 710, receiving device inputs 730 and generating device outputs 735 over a device input/output boundary 740 just as an actual device operating in its intended environment would do.

Once the functionality goals are achieved, the test generation procedure begins. The test generation procedure in accordance with the present invention comprises the following principal steps:

1. Create test sequence activity.
2. Verify device initialization.
3. Measure fault coverage (modifying test sequence activity as required).
4. Capture resulting test vectors.

Device initialization, fault-coverage measurement, and final test development are separable tasks, as will be seen from the description below.

Preferred test generation procedures in accordance with the present invention differ significantly from the traditional approach in a number of important respects. First, fault coverage is measured prior to test vector generation. That is, the test vector set used to test the device is not even written down until it has been determined that the environment emulation exercises the device fully enough, both to locate all logic design defects and to uncover any fabrication defects which might occur. Second, the amount of time required for thorough fault grading is profoundly reduced. "Fault grading" a test means determining the percentage of all possible faults in the device which are detected by the test. Third, the approach differs strategically in the sense that the environment emulation methodology will be much more likely to identify design defects even as the test is being generated.

The test sequence activity consists of one or more high-level events which drive the complete environment emulation model. These high-level events may be as simple as a single "push of the START button," or they may comprise a series of successive events (interrupts, data pattern sequences, etc.). Each event of the test sequence activity may result in the generation of hundreds or thousands of standard test vectors.

Figure 8:
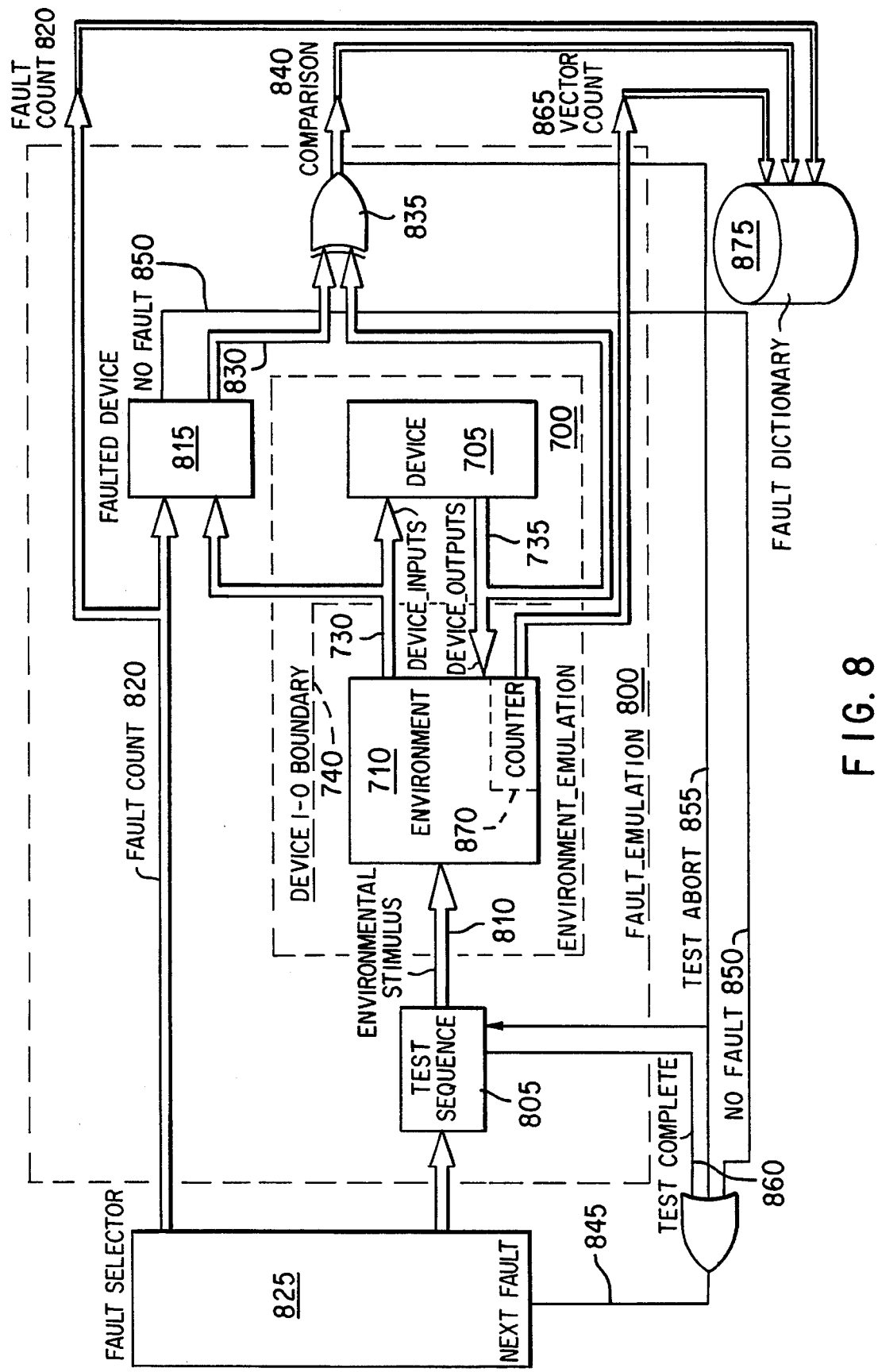
FIG. 8 illustrates the concept of fault emulation in accordance with the present invention, employing a selectively faultable emulation model and a non-faulted emulation model.

The manner in which this is done is better understood with reference to FIG. 8. A fault emulation model 800 is constructed around the environment emulation 700. A test sequence activity generator 805 supplies environmental stimulus 810 to emulated environment 710. Emulated environment 710 interacts with emulated device 705 via device input signals 730 and device output signals 735 over device I/O boundary 740. Emulated device 705 is a non-faulted, "good" device, i.e., an emulation which performs in accordance with the intended design of the target device.

A second emulation 815 of the target device, which has the capability of being selectively faulted, operates in parallel with non-faulted target device emulation 705. That is, "faulted" device emulation 815 is driven by the same device inputs 730 as is "good" device emulation 705. Faults in device emulation 815 are selectively introduced in response to a fault count signal 820 from a fault selector 825.

The device output signals 735 of "good" device emulation 705 are combined with device output signals 830 of "faulted" device emulation 815 in an exclusive-OR operation represented in FIG. 8 by XOR gate 835 to produce a comparison signal 840. For any given fault introduced into "faulted" device emulation 815, comparison signal 840 will indicate any difference which arises between the output signals 735 from "good" device 705 and the output signals 830 from "faulted" device 815 during simultaneous operation of the "good" and "faulted" devices in the emulated environment.

Fault selector 825 preferably introduces faults in "faulted" device 815 in a sequential manner by incrementing fault count signal 820 in response to a next-fault signal 845. Next-fault signal 845 is produced by combining three signals in an "OR" operation: a no-fault signal 850 from faulted device 815, a test-abort signal 855 from XOR gate 835, and a test-complete signal 860 from test sequence generator 805. No-fault signal 850 from faulted device 815 indicates that no fault has been introduced into "faulted" device 815 by the present fault count signal 820, which may occur for example when fault count signal 820 is incremented through a sequence which includes faulted as well as non-faulted operating conditions of the target device. In this case, time is saved by jumping to the next fault in the sequence of faults to be explored. Test-abort signal 855 indicates that a fault condition has been detected for the present fault in "faulted" device 815. In this case also, time is saved by terminating the test sequence being executed and jumping to the next fault in the sequence. Test-abort signal 855 is preferably the same as, or is derived from, comparison signal 840. Test-complete signal 860 indicates that the test sequence has been completed for the present fault in "faulted" device 815 without the fault having been detected.

Events making up environmental stimulus 810 result in a succession of logic pattern changes in device inputs 730 and device outputs 735 over device I/O boundary 740. Each change of logic state across device I/O boundary 740 causes the output signal 865 of a counter, such as counter 870, to be incremented. Output signal 865 thus comprises a "vector count" uniquely identifying each change of logic state across device I/O boundary 740. For each fault introduced, the fault count signal 820, the comparison signal 840 indicating differences between the output pins of device emulations 705 and 815, and a vector count signal 865 are recorded as an entry in a fault dictionary 870.

By sequentially introducing faults into "faulted" device emulation 815 and comparing the results with non-faulted device emulation 700 in an emulation of the intended operating environment, a fault dictionary 870 is developed which indicates at which vector of the environment emulation operating sequence, if any, the fault is exhibited in the output signals of the device.

Figure 9:
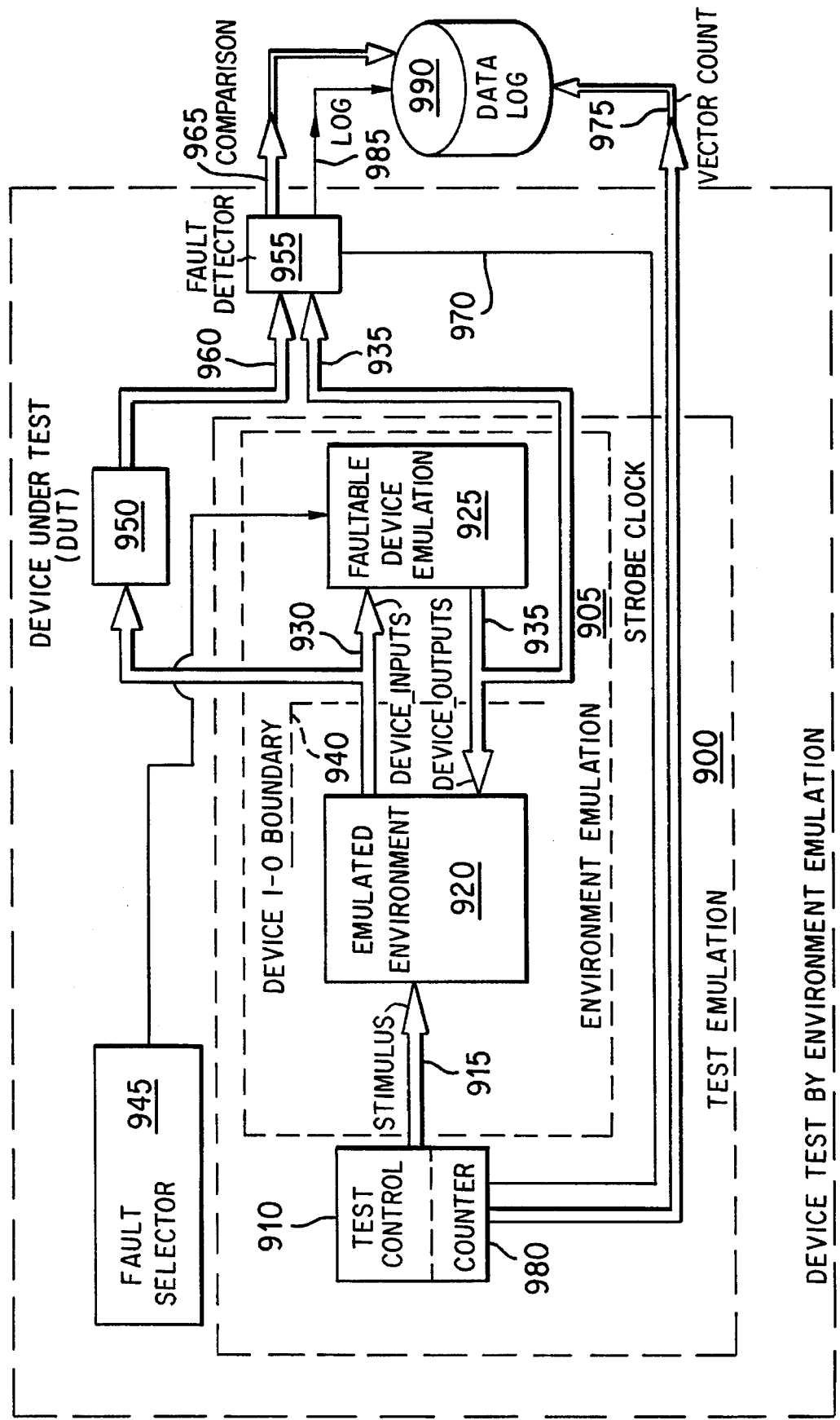
FIG. 9 illustrates the concept of testing an actual device (rather than an emulated device) using environment emulation in accordance with the present invention.

FIG. 9 illustrates how an actual device (rather than an emulated device) may be tested by environment emulation in accordance with the present invention. A test emulation model 900 is constructed around an environment emulation model 905. A test control generator 910 supplies environmental stimulus 915 to emulated environment 920. Emulated environment 920 interacts with a device emulation model 925 by means of device input signals 930 and device output signals 935 over device I/O boundary 940. Device emulation model 925 is preferably a faultable model into which faults may be selectively introduced by a fault selector 945. Device emulation model 925 is initially a non-faulted, "good" device, i.e., an emulation which performs in accordance with the intended design of the target device when no faults are introduced.

An actual device under test (DUT) 950 is operated in parallel with device emulation model 925. That is, DUT 950 is driven by the same device input signals 930 as is device emulation model 925. The device output signals 935 of device emulation model 925 are supplied to a fault detector 955, as are output signals 960 of DUT 950. Fault detector 955 produces a comparison signal 965 indicative of any differences between output signals 935 of device emulation model 925 and the signals 960 at the outputs pins of actual device 950—the "fail" pattern. Fault detection timing is under control of a strobe-clock signal 970 from test control generator 910.

Vector-count signals 975 from a counter 980 within test control generator 910 (or within the emulated environment, as in FIG. 8) indicate which test vector of a test vector sequence is currently being applied to environment emulation 905. Fault detector 955 produces a log signal 985 which triggers recording of comparison signal 965 and vector count signal 975 in a data log 990, e.g., upon detection of a fault. The content of data log 990 is used to analyze the performance of DUT 950. Results obtained in testing a particular DUT 950 may be compared with entries in fault dictionary 870 to determine the nature of any fault detected during environment emulation testing of DUT 950.

A preferred manner in which debug of DUT 950 may be facilitated will now be described with reference to FIG. 9. DUT 950 may or may not contain faults. It is desired to first determine whether DUT 950 contains one or more faults and, if so, to determine the nature of the fault or faults. A test vector pattern is applied to DUT 950 to emulation model 925, which is initially non-faulted. Output signals 950 of DUT 950 are compared with output signals 935 of emulation model 925 for each vector of the applied test vector pattern. If emulation model 925 is non-faulted and no output signal difference is detected, DUT 950 may be assumed to contain no faults, or at least no faults of a kind which may be detected by the test vector pattern in use.

If the comparison shows a difference, a fault dictionary (e.g., prepared as described above with reference to FIG. 8) is consulted to locate a matching failure pattern entry to determine the nature of the fault in the DUT. The fault dictionary may identify a plurality of faults which give rise to the same failure pattern at the output pins of the device. That is, if faults of more than one kind have identical fault dictionary entries (e.g., identical failure patterns exhibited in the output signals of the device), the nature of the fault will only be narrowed to a subset of the faults for which the fault dictionary has entries. In this case, the test vector pattern is revised in a manner which will allow these faults to be distinguished, e.g., in a manner which will produce different failure patterns for each of the subset of faults.

Typically, a test vector pattern intended for production testing of a particular type of device is devised to assure that all fault types will be detected (full fault coverage), but not to assure that the nature of each fault type will be uniquely identified in the failure pattern. It may therefore be necessary for debug purposes to prepare such a revised test vector pattern to uniquely identify certain of the possible faults.

The revised test pattern is then applied to the device and to the faultable emulation model and the results compared again; in this case, a fault suspected to exist in the device is preferably introduced in the emulation model to aid in identification of the nature of the fault. A series of suspected faults can be introduced successively into the faultable emulation model and the test vector sequence re-run for each in order to further characterize the actual fault in the DUT.

EXAMPLE

Figure 10:
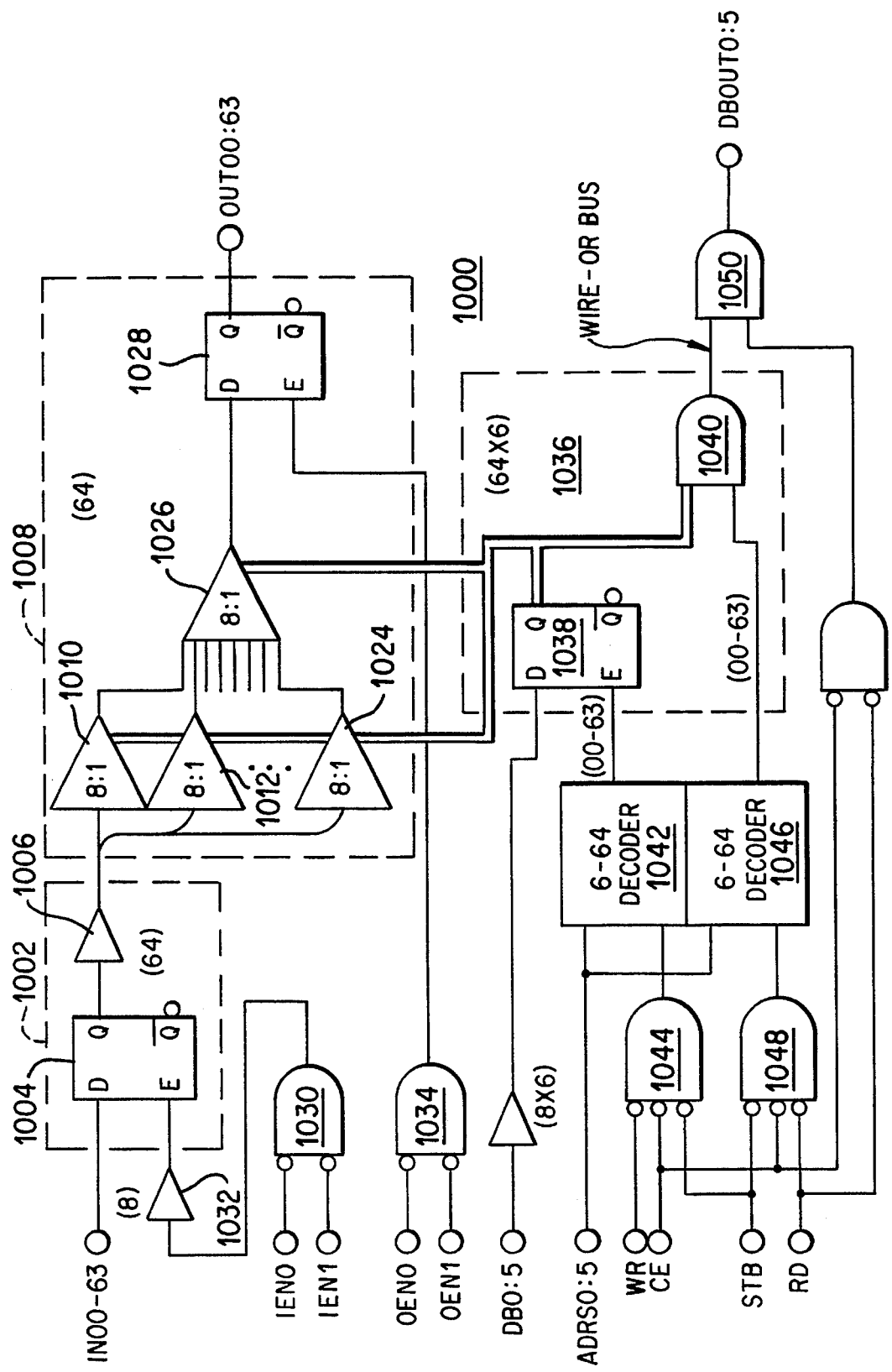
FIG. 10 schematic diagram of an exemplary 64×64 cross-point multiplexer used to illustrate the application of principles of the present invention.

Principles of the present invention may be applied, for example, to the design of a 64×64 crosspoint multiplexer (mux), a simplified schematic of which is shown at 1000 in FIG. 10. The crosspoint multiplexer is a somewhat large custom circuit whose purpose is to route any of 64 different inputs to any or all of 64 different outputs. The task is to generate an ATE production test for the mux.

In accordance with the invention, a specific sequence of environment actions is to be established to exercise the device sufficiently to extract all test vectors. While one or more environment emulations might be required to achieve this purpose for a given device, a single simplified environment is planned in order to fully exercise the device in this example. It is anticipated that a series of about a dozen successive environment-stimulus events would produce a test pattern of about 14,000 vectors. Each of these events serves to:

1. initialize the target device by emulating a CPU register-write sequence;
2. establish a starting value for a pseudo-random data path exerciser; and
3. generate a data burst from the data path exerciser.

Figure 3:
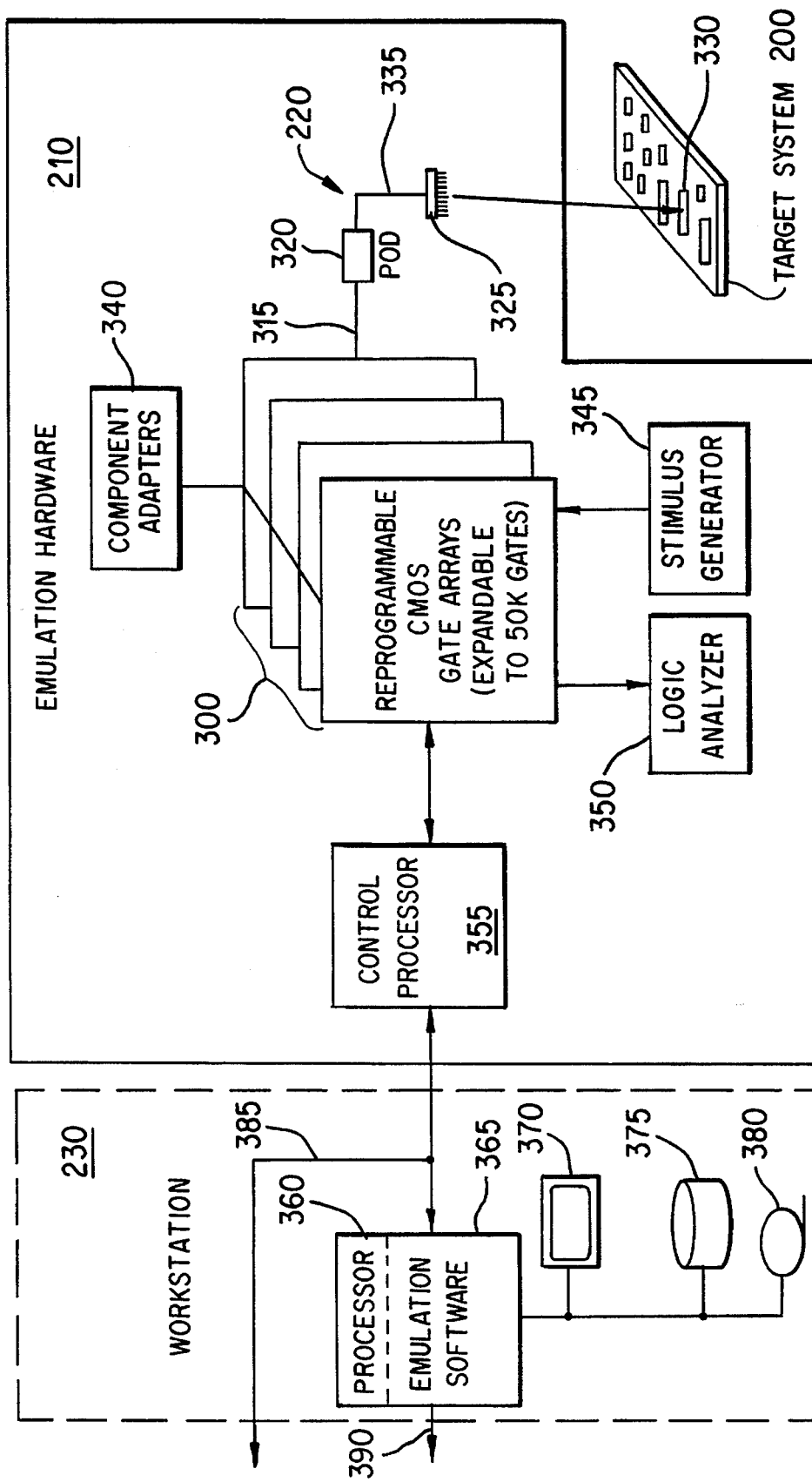
FIG. 3 shows in schematic form the principal elements of a prior-art in-circuit emulation system.
Figure 4:
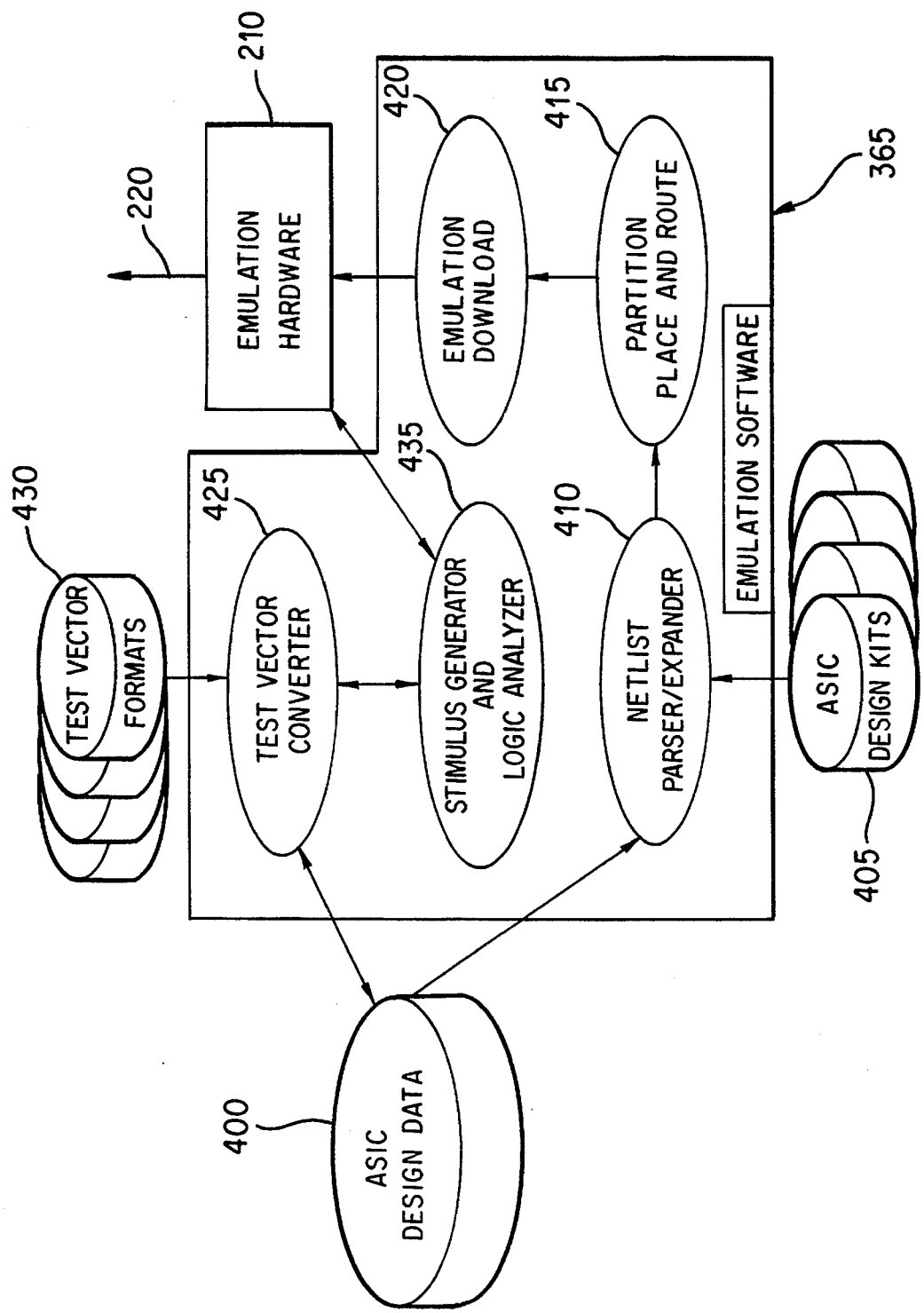
FIG. 4 shows in schematic form the principal functions of emulation software in the prior-art in-circuit emulation system of FIG. 3.
Figure 5:
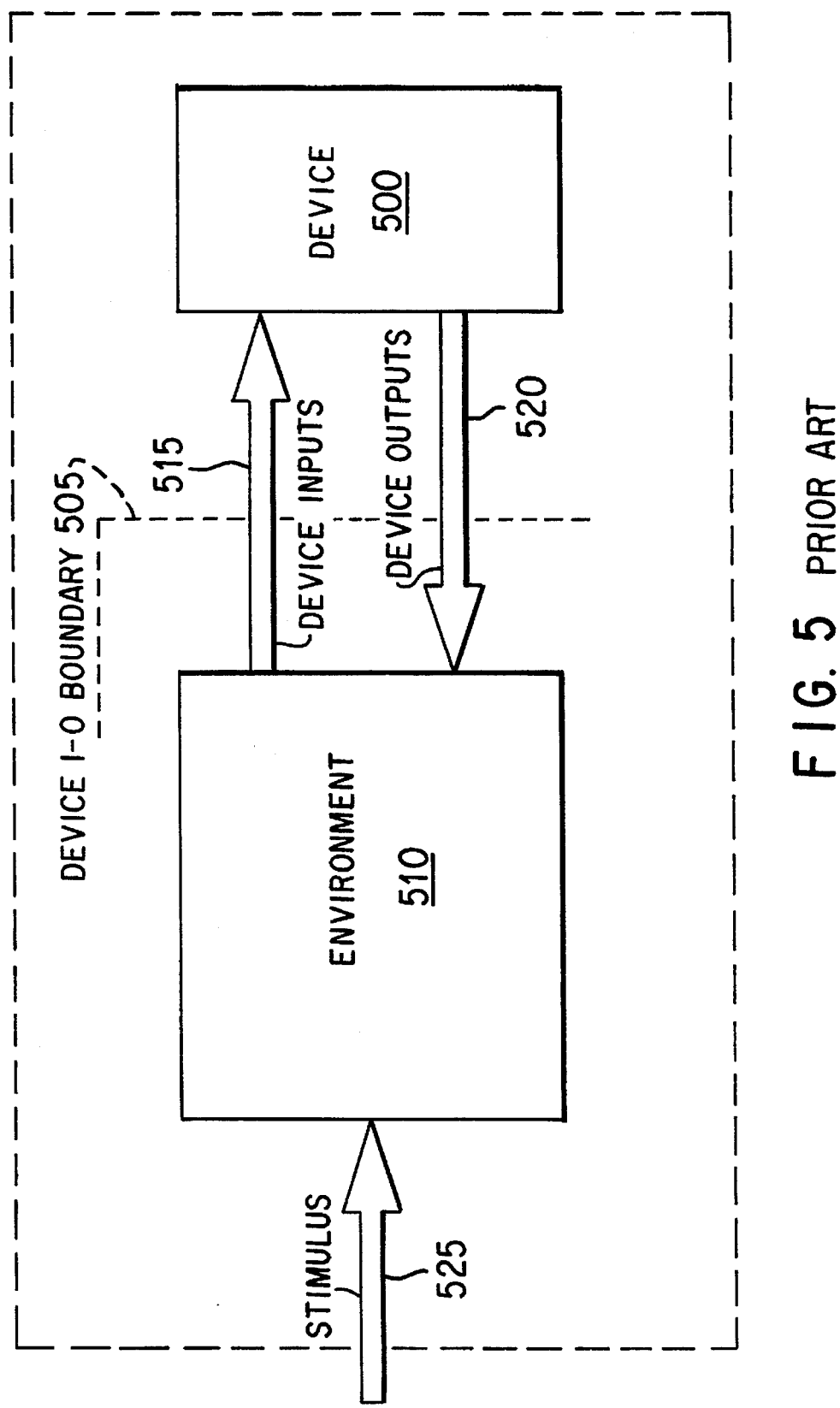
FIG. 5 illustrates schematically one manner in which emulations are used in the prior art design process.

The events are defined by a pattern generator contained as a standard part of the hardware emulation equipment of an RPM Emulation System®, e.g., stimulus generator 345 of FIG. 3.

The target device (mux 1000) is emulated several times, each time using specialized gate models created for each step in the test generation process. Two different types of specialized gate models may be used: X-state models and faultable models. The environment may be emulated using simple gate-level logic models.

Target Device Description

As shown in FIG. 10, crosspoint multiplexer 1000 has 64 input lines (labeled IN 00–63) and 64 output lines (labeled OUT 00:63). An input latch circuit 1002 is provided for each input line, the latch circuit comprising a latch 1004 and an output driver 1006. An output latch circuit 1008 is provided for each of output lines OUT 00:63. Each output latch circuit 1008 comprises a bank of eight selectively-addressable 8:1 drivers 1010–1024 feeding a further selectively-addressable 8:1 driver 1026. The output line of driver 1026 drives an output latch 1028.

An input enable NAND gate 1030, responsive to input enable signals on its respective input lines IEN0 and IEN1, supplies an enable signal via a bank of drivers 1032 to latch the data on input lines IN 00–63 into the respective input latch circuits 1002 at input enable (IEN) time. An output enable NAND gate 1034 enables the data from input latch circuits 1002 into the selected output lines (labeled OUT 00:63) of output latch enable circuits 1008 at output enable (OEN) time. The latched input lines (IN 00–63) and output lines (OUT 00:63) represent two stages of a data distribution pipeline. The respective output lines to which data on the input lines are to be routed are selected by writing the address of the selected input line into the selection register for the selected output line.

The selection registers, shown schematically at 1036, comprise a bank of 64×6 latches 1038 and AND gates 1040. When write-enable signal WR, chip enable signal CE and strobe signal STB are all low, 6–64 decoder 1042 is enabled by gate 1044. Decoder 1042 in turn enables the six selection register latches 1038 corresponding to the output address appearing on address lines ADRS 0:5. The input-line address appearing on data-bus lines DB0:5 is entered in the enabled selection-register latches 1(138 to enable the appropriate drivers 1010–1026.

When read-enable signal RD, chip enable signal CE and strobe signal STB are all low, 6–64 decoder 1046 is enabled by gate 1048 to decode an output-line address appearing on address lines ADRS 0:5. Data stored in the corresponding selection register latches, representing the input lines of mux 100 to which that output line of mux 100 is connected, are supplied via gates 1040 and 1050 to data-bus-out lines DBOUT 0:5.

Environment Description

The 64×64 mux device 1000 is used to route Algorithmic Pattern Generator (APG) patterns to user-specified pins in a high-pin-count component test system for testing memory chips. The operating environment includes a CPU which is used to write pin selection information.

Figure 11:
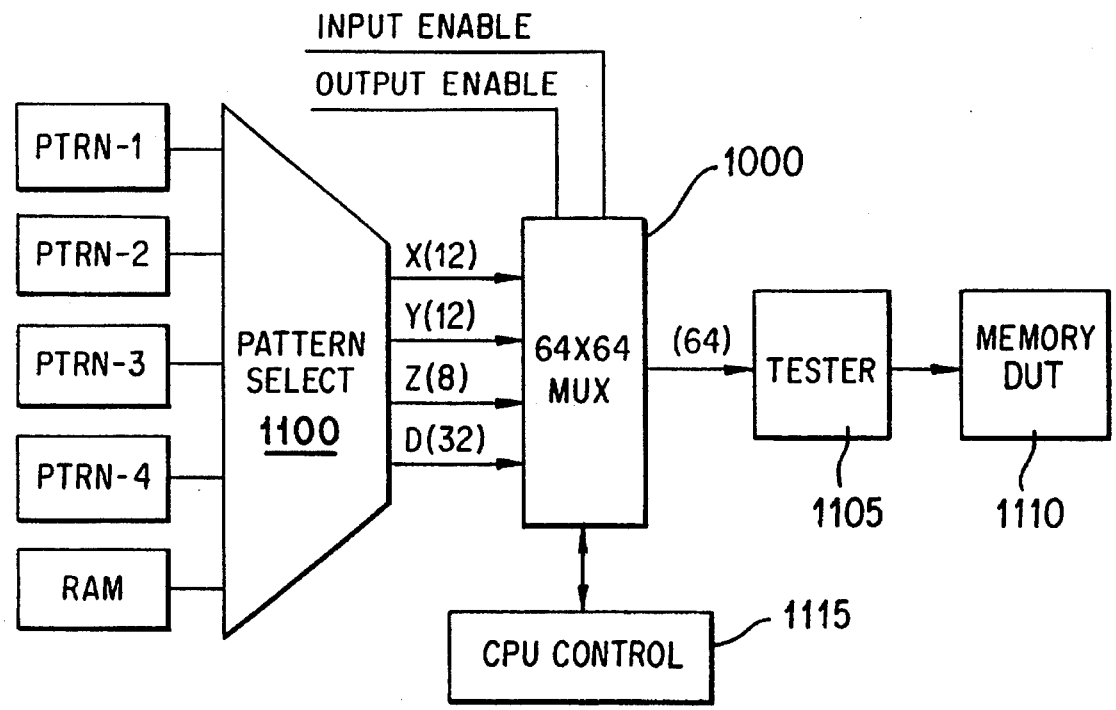
FIG. 11 is a block diagram of the intended operating environment of the 64×64 cross-point multiplexer of FIG. 10.

The simplified block diagram of FIG. 11 shows the intended operating environment of the 64×64 crosspoint multiplexer. Any of several different stored logic patterns (PTRN-1, etc.) are routed by pattern selection logic 1100 to 12-bit X address lines, 12-bit Y address lines, 8-bit Z address lines and 32-bit data (D) lines to mux 1000. The patterns are determined by the requirements of the memory chip to be tested. The address and data lines from pattern selection logic 1100 are mapped by mux 1000 into pin-driver channels of a tester 1105 connected to the pins of the memory chip 1110 to be tested. Mux 1000 is operated under control of a CPU controller 1115.

Figure 12:
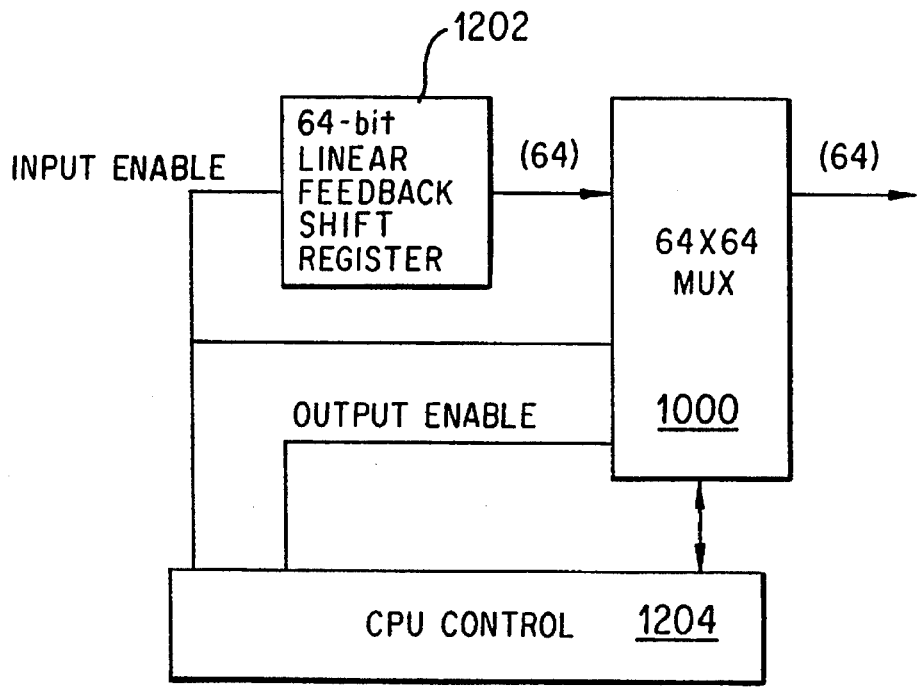
FIG. 12 is a block diagram of the operating environment of FIG. 11, as simplified for emulation in accordance with the present invention.

The environment of FIG. 11 is far more complex than needed to fully exercise the multiplexer as such. The implementation can be simplified for emulation purposes, as shown in FIG. 12, by replacing the algorithmic pattern generator with a 64-bit feedback shift register 1202 functioning as a pseudo-random pattern generator (PRG). Mux 1000 receives address and data signals from feedback shift register 1202. Input-enable and output-enable signals are provided by CPU controller 1204, which also controls mux operation.

Shift register 1202 is clocked on the rising edge of the (negative-going) input-enable pulse, so it commences changing state only after the input registers of mux 1000 have been latched. The environment emulation creates pseudorandom patterns and propagates them through the multiplexer. For special cases, shift register 1202 may be replaced with other suitable pattern sources (e.g., counters).

The bulk of the emulation problem lies in the control task of CPU 1204, as the test must guarantee all possible connections through the complex crosspoint circuitry of mux 1000. The control mechanism of CPU 1204 must behave much like pattern selection logic 1100 (FIG. 11) in exercising mux 1000. For example, it may be desired to route one mux input to all mux outputs, alternate two mux inputs, or distribute all mux inputs in various ways to all mux outputs. All of these operations are synchronized by the read and/or write processes under control of CPU 1204.

Figure 13:
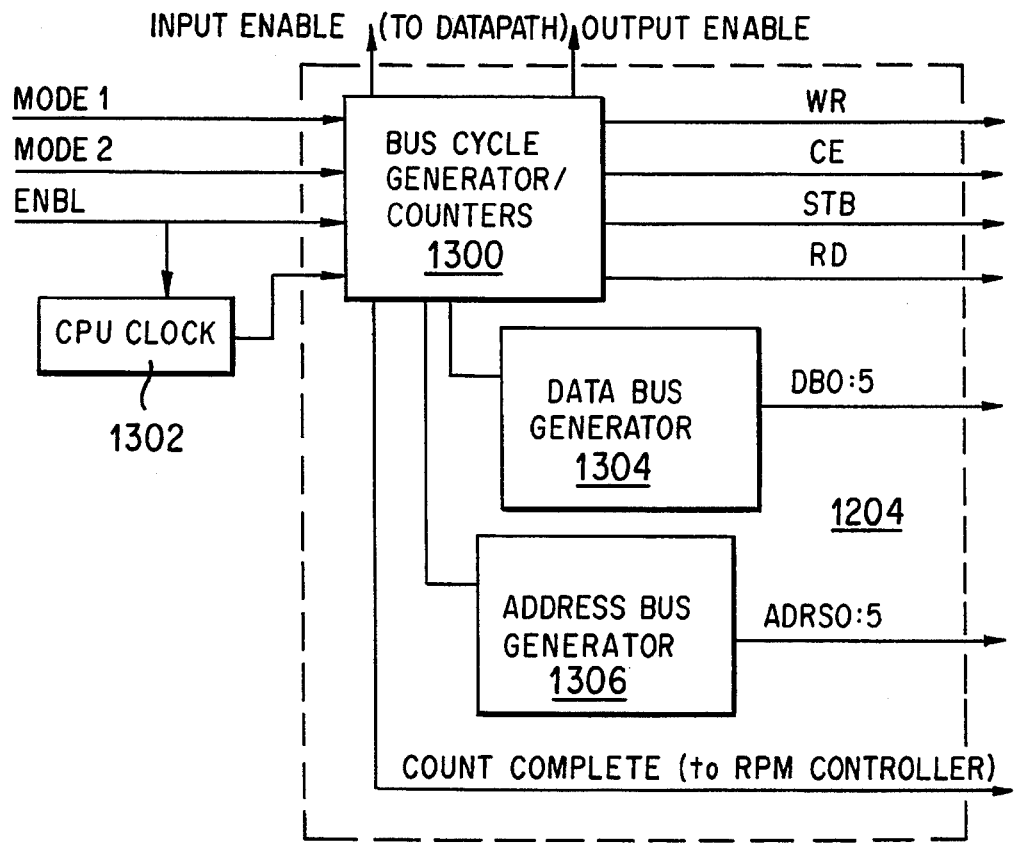
FIG. 13 is a block diagram of the CPU control portion of the environment emulation diagram of FIG. 12.

A block diagram of CPU control portion 1204 of the environment emulation is shown in FIG. 13. Bus cycle generator/counters 1300 are controlled by two external "mode" bits (MODE1 and MODE2) which determine whether a read cycle or a write cycle is enabled when emulation activity is launched. Emulation activity is launched when (CPU clock 1302 is enabled by signal ENBL after all initialization is completed. The "mode" bits and signal ENBL correspond to the environmental stimulus shown at 810 in FIG. 8 and are generated by stimulus generator 345 (FIG. 3) from stored setup data. Several different environmental stimulus patterns are generated by stimulus generator 345, each of which may represent an environmental event, such as a command from the CPU to execute a read-write cycle.

Within a data bus generator 1304 is a counter which generates a pattern of activity on data bus lines DB0:5. Within an address bus generator 1306 is a counter which generates a pattern of activity on address bus lines ADRS0:5. Databus lines DB0:5 are used to select a mux input which is to be connected to a mux output selected on address bus lines ADRS0:5. During initialization, data bus generator 1304 and address bus generator 1306 are loaded with starting count and count rate values from stimulus generator 345. These starting count and count rate values and the environmental stimulus from stimulus generator 345 determine which of several different exercise requirements is implemented.

For example, one exercise requirement is to check that various assignments of mux inputs to mux outputs are operable. The different count rate values of data bus generator 1304 and address bus generator 1306 determine how many different mux output lines are connected to each selected mux input line, i.e., how many address bus changes occur for each data bus change. The starting count values of data bus generator 1304 and address bus generator 1306 determine which mux output lines are initially connected to the selected mux input line.

Bus cycle generator/counters 1300 supply signals WR, CE, STB and RD to the emulation model of mux 1000. Bus cycle generator/counters 1300 also drive data bus generator 1304 which supplies data-bus signals DB0:5 and address bus generator 1306 which supplies address signals ADRS0:5 to the emulation model of mux 1000. COUNT COMPLETE signals are supplied to the control processor 355 (FIG. 3) of the RPM emulation system by bus cycle generator/counters 1300 to signal the end of a test sequence.

Device Initialization

The initial (power-on) state of the emulation of the device, like that of a production circuit, will normally depend on somewhat unpredictable process parameters. The initial state of the emulation almost certainly will not coincide with that of the circuit it models. If the device design incorporates adequate initialization circuitry, initialization should not be a problem. If not, various methods may be employed to assure proper initialization. Whatever method is used, initialization issues must be handled in a consistent manner.

One method is to define a logic sequence which initializes all logic elements of the device design when applied to the emulation. The initialization logic sequence may be established by a limited simulation, if desired.

Another method is to emulate the target device using models which can store and propagate initialization information. Initialization issues come in two forms: (1) unknown internal states, and (2) propagation of indeterminate state data. Just as simulations normally deal with more states than just HIGH and LOW, models are created which can store and propagate initialization information. To do this, the emulation models of gates, latches, and flip-flops are augmented to carry initialization information along with state information. For verification of device initialization, the X-state models incorporate a "data valid" term to assure proper initialization of all devices. The data-valid term propagates with the actual logic signal though the circuit. X-state models are only required in those cases where device inputs come from internal circuits with state or circuits with feedback, though it is more convenient for automation purposes to replace all cells of the target device with X-state models in the device emulation.

Figure 15:
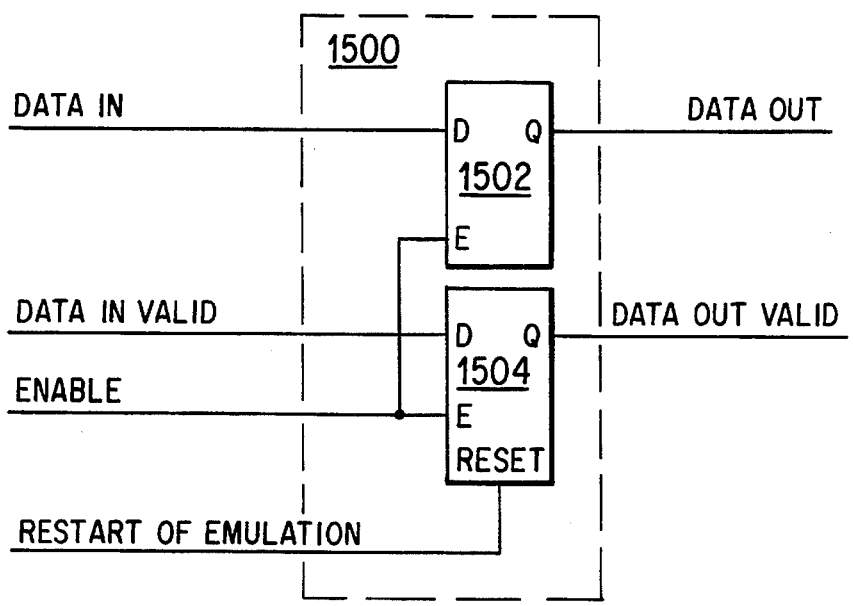
FIG. 15 is a diagram of an X-state initialization model of a latch in accordance with the present invention.
Figure 16:
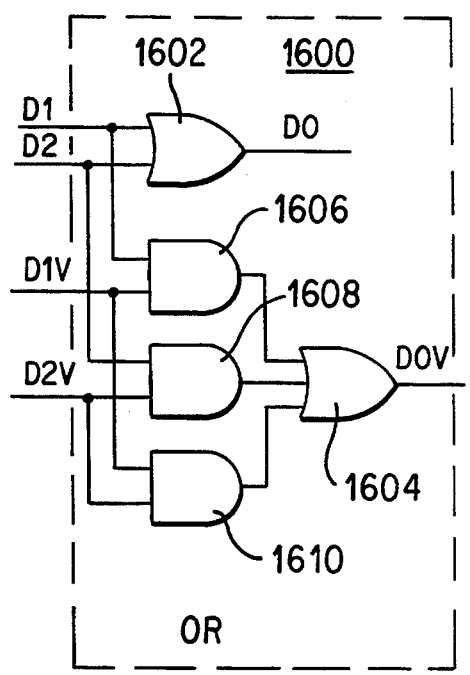
FIG. 16 is a diagram of an initialization model of an OR gate in accordance with the present invention.
Figure 17:
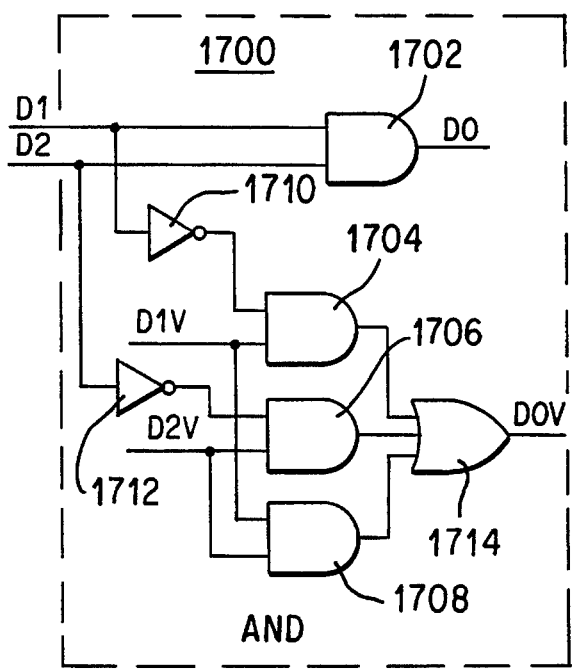
FIG. 17 is a diagram of an initialization model of an AND gate in accordance with the present invention.

Examples of X-state models are shown in FIGS. 15–17. FIG. 15 shows an X-state initialization model 1500 of a single latch, constructed of a pair of emulator latches 1502 and 1504. The "D" input line and the "Q" output line of latch 1502 serve respectively as the primary data input and data output lines of model 1500. The Data Out Valid signal from latch model 1500 is reset to a low state at the start of an emulation by signal Enable, because the output of a data latch cannot be known until data has been latched into it. As soon as signal Enable goes high, data of signal Data In will propagate to signal Data Out and data of signal Data In Valid will propagate to signal Data Out Valid. From then on, signal Data Out Valid will remain high as long as signal Data In Valid is high whenever signal Data In is high.

FIG. 16 shows an initialization model 1600 of a single OR gate, constructed of OR gates 1602 and 1604 and of AND gates 1606, 1608 and 1610. If D1 and D2 are primary input signals of model 1600, output signal DO will be valid as soon as values for D1 and D2 are specified. If either D1 or D2 is high, DO is high. For example, If D1 is known to be valid (indicated by signal D1V being high) and D1 is high, AND gate 1606 supplies a data out valid signal DOV via OR gate 1604 which says that signal DO is valid. The DOV signal is passed on to the next gate downstream of OR gate model 1600 to indicate that signal DO is valid. By "valid" is meant that the signal is not indeterminate. If signal D2 is high but not known to be valid (which may be the case when the emulator hardware is powered up), then signal D2V is low because signal D2 has not been intentionally driven to its high state. When signal D 1 goes from high to low, signal DOV also goes from high to low, indicating that the DO output signal from OR gate 1602 can no longer be trusted as valid.

FIG. 17 shows an initialization model 1700 of a single AND gate, constructed of AND gates 1702, 1704, 1706 and 1708, of drivers 1710 and 1712, and of three-input OR gate 1714. Model 1700 operates in a manner similar to model 1600.

The functioning of the data valid signals is the same in all three of models 1500, 1600 and 1700. The initialization model indicates whether data conditions are valid throughout the logic device. The data out valid signal of any gate which is connected to primary input signals will be true because all of the inputs to the logic are known. The data out valid term of each latch is set to false by resetting at the start of emulation. As the test sequence runs, a point is ultimately reached where all of the data valid signals are true; at that point the entire device state is known.

More complex library devices are implemented either from the primitives of FIGS. 15–17, or in a fashion similar to these implementations. This process effectively transforms the two-state emulator into a three-state emulator.

Before any environment or device emulation commences, a system reset associated with restart of the emulation occurs. At this time, all DataOutValid (DOV) terms associated with the storage elements or propagations from them become FALSE.

Initialization models consume device resources rather rapidly, so emulation with initialization requires more hardware elements than normal emulation. However, there is no execution time penalty. Gates driven by primary inputs do not need the expanded model. Those skilled in the art will recognize that netlist transformation software may be used to determine which model to use for emulating each element of the target device.

Fault Emulation

Two copies (emulation models) of the target circuit are created. The first copy (the "good" emulation model) consists of standard logic models. The second copy (the "faultable" emulation model) is modified so that a significant subset of it is instantiated with faultable models. For fault emulation, logic models of each cell incorporating "all possible" faults are used. For the purposes of this example, four different fault types are used: shorted stuck-at ONE, shorted stuck-at ZERO, open stuck-at ONE, and open stuck-at ZERO. A shorted fault exists at a device output—everything on the net sees the fault. An open fault is at a device input—only that specific device sees the fault.

Figure 18:
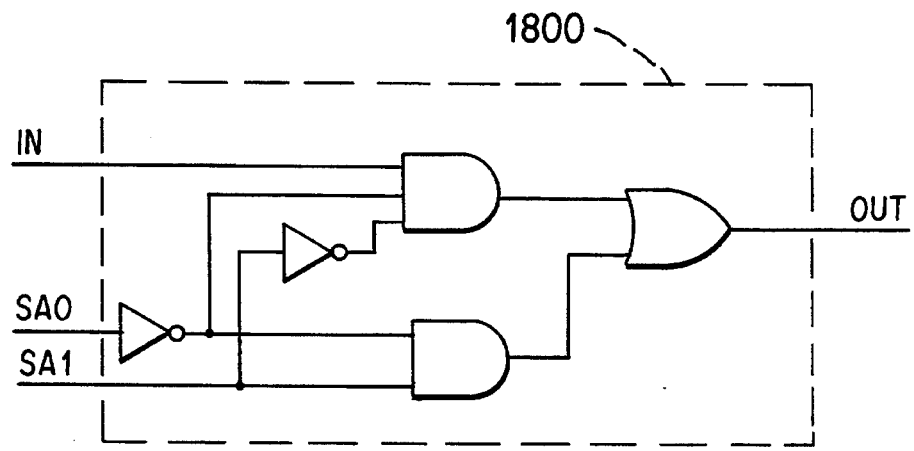
FIG. 18 a diagram of a fault injector which allows selective injection of any of four types of fault in an emulation model in accordance with the present invention.

A fault injector 1800 which allows selective injection of any of these four types of fault is illustrated in the schematic of FIG. 18. More complex fault models can both LOW, the output follows the input. If "stuck-at" line SA1 is HIGH, the output is forced HIGH. If "stuck-at" line SA0 is HIGH, the output is forced LOW. A copy of fault injector 1800 is introduced in the emulation of a target device at any point where fault injection is desired.

For each gate of mux 1000, a fault model is created which incorporates all possible faults of the above types, together with a decoder for activating each of the possible faults in that gate in succession. There are 10 different logic cells in the detailed design of mux 1000, each cell having a number of possible stuck-at faults. The following table lists for each cell of mux 1000 the cell type, the number of stuck-at faults, the number of use counts and the number of total faults:

| Cell | Cell type | Stuck-at faults | Use counts | Total faults |
|---|---|---|---|---|
| 1. | and2aaag | 8 | 70 | 560 |
| 2. | or02aaag | 8 | 3 | 24 |
| 3. | or08aaag | 20 | 54 | 1080 |
| 4. | oai21iig | 14 | 2 | 28 |
| 5. | and4haag | 12 | 18 | 216 |
| 6. | bufhhaag | 6 | 129 | 774 |
| 7. | bufhhiig | 6 | 74 | 444 |
| 8. | mux8haag | 36 | 576 | 20736 |
| 9. | dec24eig | 14 | 272 | 3808 |
| 10. | laalaag | 8 | 518 | 5180 |

Figure 19:
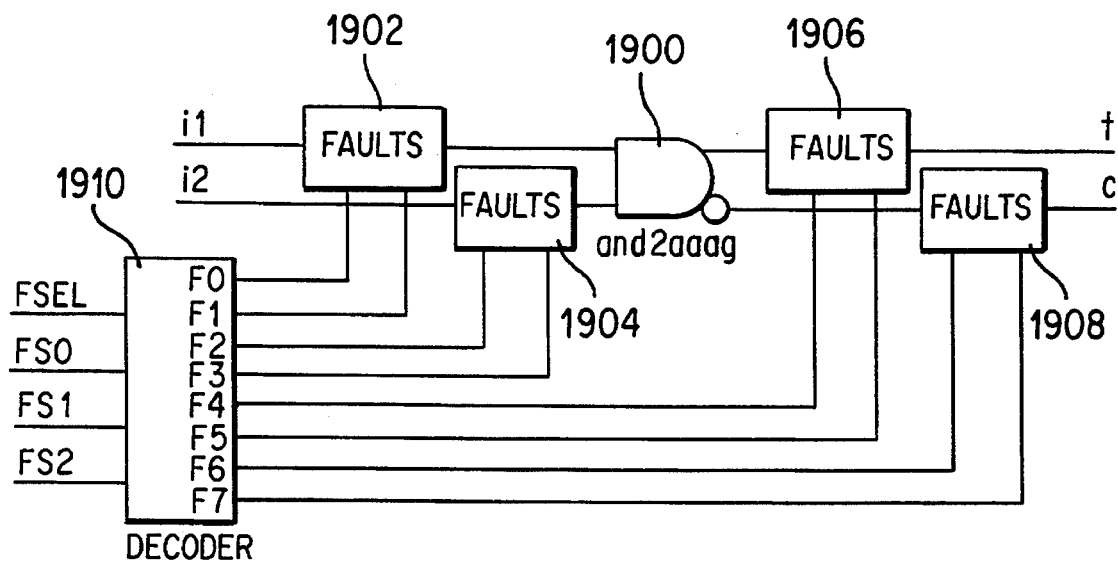
FIG. 19 is a diagram of a faultable emulation model of an AND gate cell of the crosspoint multiplexer of FIG. 10 in accordance with the present invention.

The fault model of AND gate "and2aaag" of mux 1000 is shown by way of example in FIG. 19. Fault injectors are introduced in each of the input and output lines of gate "and2aaag" 1900. That is, fault injectors 1902 and 1904 are introduced in input lines "i1" and "i2," respectively, and fault injectors 1906 and 1908 are introduced in output lines "t" and "c," respectively. A decoder 1910 having input lines FSEL, FS0, FS1 and FS2 and output lines F0–F7 allows any of the possible faults to be introduced at will by supplying the appropriate fault command to decoder 1910.

The techniques used to inject faults in the example described are rudimentary, and no hardware modifications to existing gate array emulation equipment are required to implement them. More sophisticated fault injection techniques could be used to reduce the injection time.

The available number of gates in the reprogrammable gate arrays may in some cases be insufficient to allow full simultaneous emulation of the environment, a "good" device model and a "faulted" device model containing all possible faults. In this case, a series of "faulted" device models may be programmed in sequence, with each "faulted" device model having a different subset of its cells made up of "faulted" cell models and the remainder made up of "good" cell models. That is, a first "faulted" device model is used for sequential injection of all possible faults of a first subset of cells. The emulation is then reprogrammed so that a second "faulted" device model is used for sequential injection of all possible faults of a second subset of cells, and so on until all possible faults of the target device have been explored. Reprogramming time is sufficiently small that the efficiency of emulation in accordance with the present invention remains high when compared with simulation.

Figure 20:
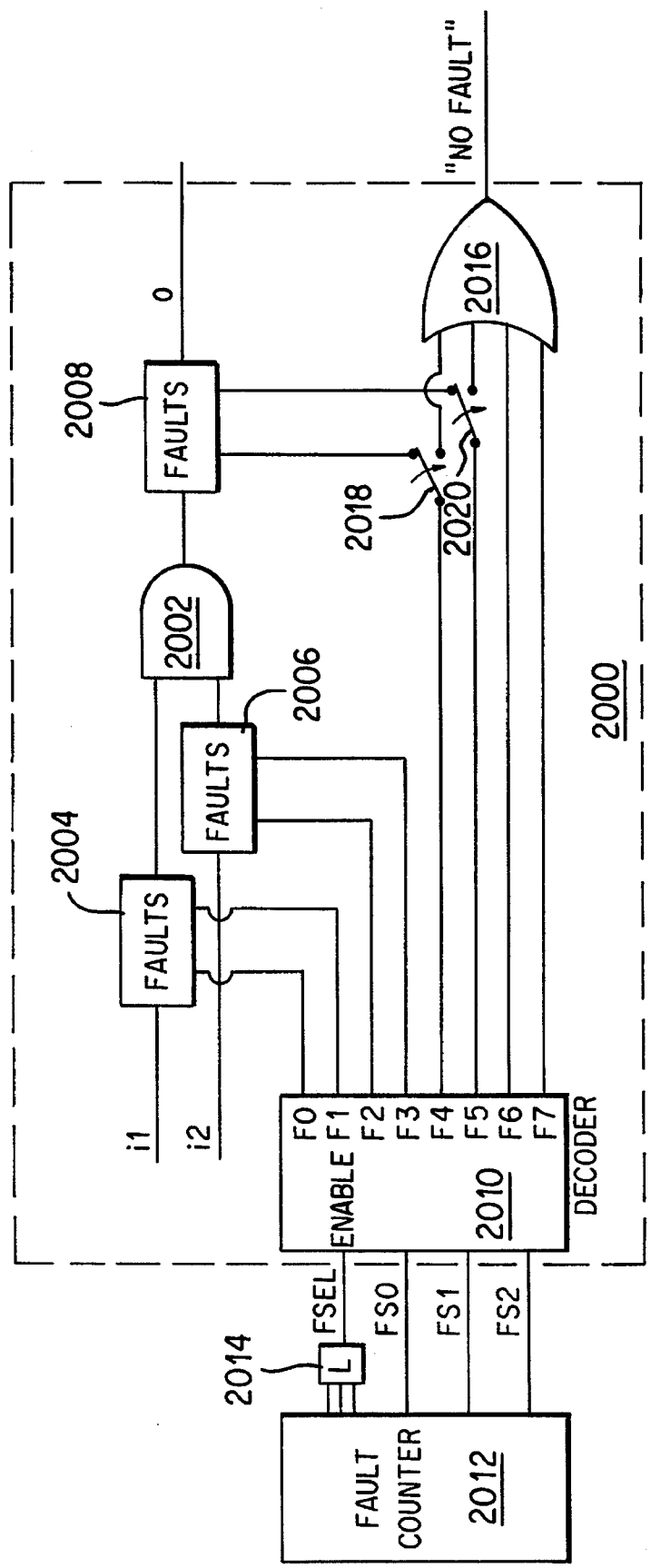
FIG. 20 is a diagram of a faultable emulation model of an AND gate illustrating the manner in which faults may be sequentially introduced in accordance with the present invention.

FIG. 20 is a diagram of a faultable emulation model 2000 of an AND gate illustrating the manner in which faults may be sequentially introduced in accordance with the present invention. An AND gate 2002 has fault injectors 2004 and 2006 in its respective input lines i1 and i2, and a fault injector 2008 in its output line O. A fault-count decoder 2010 driven by a fault counter 2012 within fault selector 825 (FIG. 8) activates the fault injectors in sequence as the fault count from fault counter 2012 is incremented. Decoder 2010 is a 3-line to 8-line decoder with enable, which permits numerical assignment of each fault for record-keeping. A further decoder 2014 decodes additional counter bits to make possible fault injection for multiple circuits.

Fault insertion decoding is simplified by expanding each fault model decoder to a power of 2 and associating unused counts with a "no-fault" output signal. Following is an exemplary sequential fault activation table:

| Fault Count | Fault Condition |
| --- | --- |
| 00 | i2 stuck at 0 |
| 01 | i2 stuck at 1 |
| 02 | i1 stuck at 0 |
| 03 | i1 stuck at 1 |
| 04 | O stuck at 0 |
| 05 | O stuck at 1 |
| 06 | no_fault |
| 07 | no_fault |

As fault counts 06 and 07 are not needed to activate faults, they go into an OR gate 2016 which provides a "no-fault" output signal. OR gate 2016 is shown possibly connected (by switches 2018 and 2020) to the two output fault cases, indicating that these faults can be disabled in a specific model instance if a circuit being modeled is not subject to that particular fault. Input fault cases could be similarly disabled.

The "no-fault" output signal of OR gate 2016, combined with similar no-fault signals from other faultable circuit models, is used to abort emulation test sequences during fault detection analysis as described above with reference to FIG. 8. Whenever the fault insertion counter reaches a count value for which the no-fault signal in the corresponding circuit is active, it immediately increments to the next count without running the circuit emulation.

Operation of the Emulation System

After loading the emulation and the selected logic analyzer connections into the Quickturn RPM equipment, the mode bits and other initialization values are set and CPU clock 1302 (FIG. 13) is enabled to commence operation. CPU clock 1302 is gated by signal ENBL, which assures synchronous operation of bus cycle generator/generators 1300 and the other circuitry. The datapath latch clocking of the emulation model of mux 1000 is also driven by bus cycle generator/counters circuitry 1300, so the dataflow process is properly synchronized with mux path selection. The bus cycle control generates the read (RD), write (WR), strobe (STB) and chip-enable (CE) signals and successively loads each of the emulated mux selection registers with a predetermined value to activate the mux datapaths.

Figure 14:
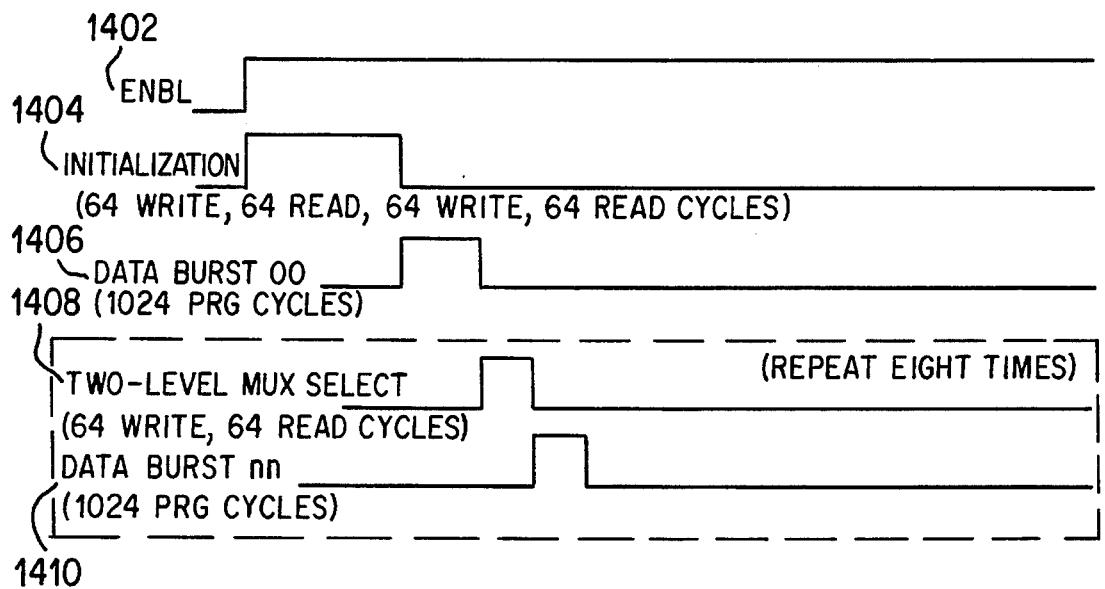
FIG. 14 shows a timing diagram for the emulation sequence of the crosspoint multiplexer and environment of FIGS. 10–13 in accordance with the present invention.

A timing diagram for the emulation sequence is shown in FIG. 14. The emulation sequence is launched by enable signal ENBL 1402, which corresponds to the push of a "Start Button." An initialization sequence 1404 writes all 64 selection registers of the mux emulation with independent address-coded data values, verifies the values using the readback path, then for each register writes the complement of the data values and verifies the complement values. This establishes that each input of the mux selection registers is connected to one and only one output of the mux, and that all program bits function.

After completion of the initialization sequence, each output of the mux emulation is connected to a separate input path of the mux emulation. A 1024-cycle data burst 1406 (comprising 1024 pseudo-random generator cycles) is then supplied by feedback shift register 1202 to the mux emulation, which comes close to assuring that all internal mux inputs are connected. Since it is possible that for some particular data path no change will occur for 1024 cycles, a stuck-at-fault condition on that path would not be detected at this stage. Proof of fault coverage is deferred until fault simulation time.

For the balance of the testing, it is hypothesized that two-level separability of the layers of multiplexing in mux 1000 will permit full cross-point verification in eight cycles of selection and data distribution, using octal coding of 00, 11, 22, 33, 44, 55, 66, 77 for each of the latches. Each value is written in all selection registers, as represented by line 1408 of FIG. 14, and then a 1024-cycle burst of activity from feedback shift register 1202 is executed, as represented by line 1410 of FIG. 14.

The test sequence so created consists of approximately 14,000 test vectors. It is estimated that execution of such a sequence in a VERILOG simulator would require about 15,000 seconds. In contrast, execution of such a sequence with emulation using a Quickturn RPM Emulation System is estimated to require less than 100 milliseconds.

The two emulation models—"good" and "faultable"—are driven in parallel by the environment emulation. The "good" emulation model is used to respond to the environment emulation. Faults are not introduced in the "good" model. Only a subset of the cell models making up the initial "faultable" model are capable of being faulted, due to limited availability of emulator gates. The selectors for the "faultable" emulation model, and the logic which activates them, are both incorporated in the environment emulation. The fault selection logic is driven by a fault selection index counter. The fault selection index counter is incremented after each full test cycle, logically advancing the "faultable" model to the next stuck-at fault. After all faults of the initial "faultable" model have been emulated, the emulation system is reprogrammed to include a revised "faultable" model for emulation of a different set of faults. It is estimated that an average of 15 ms per fault is required for reprogramming, using the sequential fault injection techniques described above.

The planned environment emulation activity sequence is executed for each fault. The output signals of the two models are combined in an exclusive-OR (XOR) operation to determine whether the activated fault has been detected. The fault selection index, the clock cycle number (test vector number), and the fail pattern at the time of fault detection are recorded. This procedure is conceptually similar to traditional fault simulation. However, as the time required to activate each successive fault and execute the full 14,000-vector pattern is less than 100 milliseconds plus model loading overhead, the full test grading process is estimated to require less than one hour for some 32,580 fault insertions.

Emulation in accordance with the invention makes the processes of augmenting and qualifying the test vector set much less time-consuming than would be the case with simulation. If the 32,580 possible faults of this example were to be injected individually in a simulation, with a 15,000-second simulation run to verify that each fault was detected by the test pattern, some 120,000 hours of simulation time would be required. Fault simulation is of course not run in this way, but instead uses algorithms which, for an example of this kind, are estimated to require on the order of 30–60 hours of processing.

Test Vector Generation and Execution

On completion of the fault coverage verification, the actual test pattern can be recorded. This consists of running the now fully verified and approved sequence of activity bursts using the "good" emulation of the target device, and recording the input and output logic vectors of the device emulation appearing at the device I/O boundary for each clock cycle. For example, the "good" device emulation takes the place of device 705 of FIG. 7, and device inputs 730 and device outputs 735 at device I/O boundary 740 are recorded as environment 710 is stimulated by test control system 720. If the number of input and output pins of the emulated device exceeds the available recording capability, the pin activity may be collected in multiple iterations. The recorded logic vector sequence may be ported directly to standard ATE without major effort.

Device Timing and Race Conditions

Emulation is not effective for device timing. As noted above, circuit emulations using programmable gate arrays may operate a factor of ten or more slower than the target device. While many device designs do not have potential speed problems (in that the speed requirement is inherently much less than the available emulation process speed) the issue of operation at full rated speed of the target device remains significant.

There are several distinct approaches to this aspect of the device design and the test development problem. First, detailed timing analysis in software is quite feasible and typically will take much less execution time than full simulation, though this requires application of timing library models and related technology. Second, limited simulations designed explicitly for timing analysis can be used to verify that the fabricated device will in fact operate at the target speed. Finally, if the issue is more one of speed grading than of achieving a specific operating goal, devices can be built following emulation verification and then execution speeds can be determined for binning purposes. In any event, traditional ATE systems can be used to establish operating speeds in the production test environment, while environment emulation can be used to develop and verify the test vector sets which are to be used to operate the traditional ATE systems for speed verification or binning.

A timing test vector set can be developed and verified using the emulation technology. Then, this (presumably much shorter) vector set can be run on a simulator to establish timing margins and potential device speed. In the example described with reference to mux 1000, VERILOG simulations with sharply restricted vector sets can be used to validate device timing. The actual time spent in timing validation simulation is not large, and simulations need not start until the emulation environment has already proven the overall target device design and the target timing vector set. Translation of the environment and device models into a VERILOG simulation can be accomplished using standard vendor-supplied software.

Conclusion

Those skilled in the art will recognize that the present invention is not limited to the preferred embodiments described above, and that many modifications are possible within the spirit and scope of the invention as defined in the claims which follow.

I claim:

1. A method for generating a record of faults detected by a pattern of test vectors applied to a logic device, comprising the steps of:
   a. creating a first emulation of a logic device;
   b. creating a second emulation of the logic device;
   c. selectively introducing a fault into the second emulation;
   d. applying a pattern of test vectors to the first emulation and to the second emulation, to thereby exercise the first emulation and the second emulation;
   e. comparing output signals produced by the first emulation and the second emulation in response to each test vector of the pattern, to thereby detect the selectively introduced fault by detecting any difference between the output signals;
   f. upon detection of the selectively introduced fault, producing a record identifying the fault introduced into the second emulation; and
   g. repeating steps c.–f. for each of a sequence of selectively introduced faults, to thereby produce a record identifying which faults of the sequence of faults result in differences between the output signals of the first emulation and the second emulation.

2. The method according to claim 1, wherein step f. further comprises the step of recording an identification of a test vector of the pattern of test vectors at which the selectively introduced fault is detected.

3. The method according to claim 2, wherein step f. further comprises the step of recording a signal indicative of any difference between the output signals upon detection of the selectively introduced fault.

4. The method according to claim 1, wherein step d. comprises the step of simultaneously applying the pattern of test vectors to the first emulation and to the second emulation, to thereby exercise the first emulation and the second emulation in parallel.

5. The method according to claim 1, wherein said first emulation and said second emulation each comprise a plurality of gates having internal logic states, further comprising the step of initializing the internal logic states of said gates prior to applying said pattern of test vectors.

6. The method according to claim 1, wherein step a. comprises the step of creating a first emulation of the logic device, the first emulation comprising a plurality of gate models which include the capability of conveying initialization information along with logic states, the method further comprising the step of initializing logic states of said gate models prior to applying said pattern of test vectors.

7. The method according to claim 6, wherein step b. comprises the step of creating a second emulation of the logic device, the second emulation comprising a plurality of selectively-faultable gate models including the capability of conveying initialization information along with logic states, the method further comprising the step of initializing logic states of said gate models prior to applying said pattern of test vectors.

8. The method according to claim 1, wherein the logic device includes at least one latch, and wherein step b. comprises the step of emulating at least one latch of the logic device by preparing a logic model having a first logic path for conveying logic data and a second logic path for conveying initialization information.

9. The method according to claim 1, wherein the logic device includes at least one OR gate, and wherein step b. comprises the step of emulating at least one OR gate of the logic device by preparing a logic model having a first logic path for conveying logic data and a second logic path for conveying initialization information.

10. The method according to claim 1, wherein the logic device includes at least one AND gate, and wherein step b. comprises the step of emulating at least one AND gate of the logic device by preparing a logic model having a first logic path for conveying logic data and a second logic path for conveying initialization information.

11. The method according to claim 1, wherein each said fault is associated with a respective fault sequence count, wherein step g. comprises the step of incrementing a fault sequence count, and wherein each repetition of step c. comprises introducing a fault corresponding to the incremented fault sequence count.

12. The method of claim 1, wherein step b. comprises the steps of dividing a circuit design of the logic device into multiple cells, and creating a faultable model of each said cell.

13. The method of claim 1, wherein step b. comprises the steps of dividing a circuit design of the logic device into multiple cells, and creating a faultable model of each said cell having at least one node capable of assuming at least one stuck-node condition.

14. The method of claim 1, wherein step b. comprises the steps of dividing a circuit design of the logic device into multiple cells, and creating a faultable model of each said cell having at least one fault injector capable of assuming a stuck-node condition.

15. The method of claim 1, wherein step b. comprises the steps of dividing a circuit design of the logic device into multiple cells, creating a faultable model of each said cell having at least one fault injector capable of assuming a stuck-node condition in response to a decoder signal, and wherein each repetition of step c. comprises supplying a decoder signal to one of said fault injectors.

16. The method of claim 1, wherein each repetition of step f. comprises the steps of recording a fault count signal representing the fault introduced into the second emulation, recording a comparison signal representing any difference detected in step e., and recording a vector count signal representing a test vector of said pattern of test vectors at which any difference is detected in step e.

17. The method according to claim 1, wherein step b. comprises the step of programming a reprogrammable array of gates.

18. The method according to claim 17, wherein step a. comprises the step of programming a reprogrammable array of gates.

19. The method according to claim 17, wherein step d. comprises the steps of programming a reprogrammable array of gates to create an environmental emulation of an intended operating environment of the integrated circuit capable of applying the pattern of test vectors to the first emulation and the second emulation, and operating the environmental emulation to apply the pattern of test vectors to the first emulation and to the second emulation.

20. A method of concurrently developing an integrated circuit design and a pattern of test vectors suitable for production testing of integrated circuits constructed in accordance with the design, comprising the steps of:

a. preparing a design of an integrated circuit;

b. preparing a set of test vectors for exercising the integrated circuit;

c. creating a non-faulted emulation of the integrated circuit;

d. creating a faultable emulation of the integrated circuit;

e. selectively introducing one of a sequence of faults in the faultable emulation;

f. applying a pattern of test vectors to the non-faulted emulation and to the faultable emulation, to thereby exercise the non-faulted emulation and the faultable emulation;

g. comparing output signals produced by the non-faulted emulation and the faultable emulation in response to each test vector of the applied pattern of test vectors, to thereby detect the selectively introduced fault by detecting any difference between the output signals;

h. repeating steps e.–g. for each fault of the sequence of faults;

i. determining an extent of fault coverage by comparing the number of detected faults with a count of the number of faults introduced in the faultable emulation:

j. modifying the design of the integrated circuit and the pattern of test vectors; and k. repeating steps b.–i., for each modification of the design of the integrated circuit and the pattern of test vectors.

21. The method according to claim 20, further comprising the step for each repetition of steps d.–f. of recording an identification of a test vector of the pattern of test vectors at which the selectively introduced fault is detected.

22. The method according to claim 21, further comprising the step for each repetition of steps d.–f. of recording an identification of each selectively introduced fault which is detected.

23. The method according to claim 20, further comprising the steps of:

l. applying the pattern of test vectors of a final repetition of steps b.–i. to a non-faulted emulation of said final repetition of steps b.–i.;

m. recording input and output logic patterns of said first emulation during step l, to thereby record a test vector pattern suitable for production testing of a device constructed according to the non-faulted emulation of said final repetition of steps b.–i.

24. A method of testing a device having a logic circuit and input pins and output pins, comprising the steps of:

a. preparing a fault dictionary comprising an entry for each of a plurality of possible faults in the device, each said entry identifying the fault and a test vector of a test vector pattern at which said fault is exhibited at output pins of the device when the test vector pattern is applied to input pins of the device;

b. preparing an emulation model of the device by programming a plurality of gates of a programmable gate array, said emulation model having input lines and output lines corresponding to input pins and output pins of the device;

c. applying the test vector pattern to input pins of the device and to input lines of the emulation model, to thereby exercise the device and the emulation model;

d. for each test vector of the applied test vector pattern, comparing signals appearing at output pins of the device with signals appearing at output lines of the emulation model to produce a comparison signal indicative of any difference between the signals appearing at output pins of the device and the signals appearing at output lines of the emulation model;

e. upon detection of any said difference, recording said comparison signal and an identification of a test vector at which said difference is detected; and f. comparing the identification of a test vector recorded in step e. with entries of said fault dictionary to identify at least one possible fault in the device which can produce said difference.

25. The method according to claim 24, wherein step a. comprises the steps of:

i. creating a non-faulted emulation model of the device;

ii. creating a faultable emulation model of the device, the second emulation model including the capability of being selectively faulted;

iii. selectively introducing a fault into the faultable emulation model;

iv. applying a pattern of test vectors to the non-faulted emulation model and to the faultable emulation model, to thereby exercise the non-faulted emulation model and the faultable emulation model;

v. comparing output signals produced by the non-faulted emulation model and the faultable emulation model in response to each test vector of the series, to thereby detect the selectively introduced fault by detecting any difference between the output signals;

vi. upon detection of the selectively introduced fault, producing a record identifying the fault introduced into the faultable emulation model and a test vector at which the selectively introduced fault is exhibited in output signals of the faultable emulation model; and vii. repeating steps iii.–vi. for each of a sequence of selectively introduced faults, to thereby produce said fault dictionary.

26. The method according to claim 24, wherein each entry of the fault dictionary further includes a representation of a failure pattern appearing at the output pins of the device when said at least one fault is exhibited, the method further comprising the steps of:

g. introducing in the emulation model a fault identified in step f., to thereby produce a faulted emulation model;

h. applying a test vector pattern to input pins of the device and to input lines of the faulted emulation model, to thereby exercise the device and the faulted emulation model;

i. for each test vector of the test vector pattern applied in step h., comparing signals appearing at output pins of the device with signals appearing at output lines of the faulted emulation model, to thereby determine whether a failure pattern appearing at the output pins of the device is the same as a failure pattern appearing at the output lines of the faulted emulation model.

27. A method of testing a device having a logic circuit and input pins and output pins, comprising the steps of:

a. preparing a fault dictionary comprising an entry for each of a plurality of possible faults in the device, each said entry identifying the nature of the fault and a test vector of a test vector pattern at which said fault is exhibited at output pins of the device when the test vector pattern is applied to input pins of the device, and a failure pattern representation of signals at output pins of the device when said fault is exhibited, wherein multiple entries have identical failure pattern representations;

b. preparing an emulation model of the device by programming a plurality of gates of a programmable gate array, said emulation model having input lines and output lines corresponding to input pins and output pins of the device;

c. applying the test vector pattern to input pins of the device and to input lines of the emulation model, to thereby exercise the device and the emulation model;

d. for each test vector of the applied test vector pattern, comparing signals appearing at output pins of the device with signals appearing at output lines of the emulation model to produce a comparison signal indicative of any difference between the signals appearing at output pins of the device and the signals appearing at output lines of the emulation model;

e. upon detection of any said difference, recording said comparison signal and an identification of a test vector at which said difference is detected;

f. comparing the identification of a test vector recorded in step e. with entries of said fault dictionary to determine the nature of at least one possible fault in the device which cap produce said difference and to determine whether the fault dictionary entry for said at least one possible fault has a unique failure pattern representation; and g. preparing a revised test vector pattern capable of exercising the device and the emulation model in a manner which will distinguish between said at least one possible fault and other possible faults for which the fault dictionary entries include identical failure patterns.

28. The method according to claim 27, further comprising the steps of:

h. introducing in the emulation model a fault identified in step f., to thereby produce a faulted emulation model;

i. applying the revised test vector pattern to input pins of the device and to input lines of the emulation model, to thereby exercise the device and the emulation model;

j. for each test vector of the revised test vector pattern applied in step i., comparing signals appearing at output pins of the device with signals appearing at output lines of the emulation model to thereby determine whether a failure pattern appearing at the output pins of the device is the same as a failure pattern appearing at the output lines of the faulted emulation model.

* * * * *